US010401696B2

(12) United States Patent
Watanabe et al.

(10) Patent No.: US 10,401,696 B2
(45) Date of Patent: Sep. 3, 2019

(54) ELECTRONIC APPARATUS AND METHOD FOR MANUFACTURING THE SAME

(71) Applicant: Japan Display Inc., Tokyo (JP)

(72) Inventors: Yoshihiro Watanabe, Tokyo (JP); Yoshikatsu Imazeki, Tokyo (JP); Yoichi Kamijo, Tokyo (JP); Shuichi Osawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 32 days.

(21) Appl. No.: 15/661,443

(22) Filed: Jul. 27, 2017

(65) Prior Publication Data

US 2018/0031938 A1 Feb. 1, 2018

(30) Foreign Application Priority Data

Jul. 29, 2016 (JP) ................................. 2016-149610

(51) Int. Cl.
*H05K 3/40* (2006.01)
*H05K 3/36* (2006.01)
(Continued)

(52) U.S. Cl.
CPC ...... *G02F 1/136286* (2013.01); *G02F 1/1339* (2013.01); *G02F 1/13338* (2013.01); *H05K 1/115* (2013.01); *H05K 1/144* (2013.01); *H05K 3/002* (2013.01); *H05K 3/0026* (2013.01); *H05K 3/366* (2013.01); *H05K 3/4038* (2013.01); *G02F 1/1368* (2013.01); *G02F 1/133345* (2013.01); *G02F 1/133512* (2013.01); *G02F 1/133514* (2013.01); *G02F 1/133528* (2013.01); *G02F 1/134363* (2013.01); *G02F 1/136213* (2013.01); *G02F 2001/13629* (2013.01); *G02F 2001/133519* (2013.01);
(Continued)

(58) Field of Classification Search
CPC ...... H05K 1/144; H05K 1/115; H05K 3/4038; H05K 3/0026; G02F 2201/42; G02F 2001/13629
See application file for complete search history.

(56) References Cited

U.S. PATENT DOCUMENTS 6,225,966 B1 * 5/2001 Ohtani ............. G02F 1/136213
257/E29.147
6,495,451 B2 * 12/2002 Hattori ............. H01L 21/31144
257/E21.257
(Continued)

FOREIGN PATENT DOCUMENTS

JP       2002-40465 A      2/2002
JP     2010232249 A  * 10/2010 ............. B23K 26/00
WO  WO-2017094457 A1 *  6/2017 ............. B23K 26/00

*Primary Examiner* — Nathan Milakovich
(74) *Attorney, Agent, or Firm* — K&L Gates LLP

(57) ABSTRACT

According to one embodiment, an electronic apparatus includes a first substrate, a second substrate, and a connecting material. The second substrate includes a second basement and a second conductive layer. The second basement has a third surface opposed to the first conductive layer and a fourth surface and is spaced apart from the first conductive layer. The second substrate has a first hole penetrating the second basement. The first substrate has a second hole. A third opening of the second hole is smaller than a first opening of the first hole. A connecting material connects the first conductive layer and the second conductive layer via the first hole.

14 Claims, 16 Drawing Sheets

(51) Int. Cl.
  *H05K 1/14*   (2006.01)
  *H05K 1/11*   (2006.01)
  *G02F 1/1339*   (2006.01)
  *G02F 1/1362*   (2006.01)
  *G02F 1/1333*   (2006.01)
  *H05K 3/00*   (2006.01)
  *G02F 1/1368*   (2006.01)
  *G02F 1/1343*   (2006.01)
  *G02F 1/1335*   (2006.01)

(52) U.S. Cl.
  CPC ............ *G02F 2001/136295* (2013.01); *G02F 2201/121* (2013.01); *G02F 2201/123* (2013.01); *G02F 2201/42* (2013.01); *H05K 2201/041* (2013.01); *H05K 2201/09036* (2013.01); *H05K 2201/09827* (2013.01); *H05K 2201/10136* (2013.01); *H05K 2203/107* (2013.01)

(56) References Cited

U.S. PATENT DOCUMENTS

| | | | | |
|---|---|---|---|---|
| 7,560,371 | B2* | 7/2009 | Dando | H01L 21/76898 |
| | | | | 257/E23.067 |
| 9,232,652 | B2* | 1/2016 | Fushie | H05K 3/423 |
| 10,061,170 | B2* | 8/2018 | Osawa | B23K 26/57 |
| 10,197,875 | B2* | 2/2019 | Koide | G02F 1/133345 |
| 10,222,657 | B2* | 3/2019 | Shibano | G02F 1/133345 |
| 10,222,669 | B2* | 3/2019 | Imazeki | G02F 1/136286 |
| 10,248,271 | B2* | 4/2019 | Imazeki | G02F 1/1339 |
| 10,268,299 | B2* | 4/2019 | Watanabe | G06F 3/0412 |
| 2006/0289203 | A1* | 12/2006 | Oda | H01L 21/486 |
| | | | | 174/264 |
| 2012/0261179 | A1* | 10/2012 | Yamamoto | H01L 23/49827 |
| | | | | 174/264 |
| 2018/0032204 | A1* | 2/2018 | Imazeki | G06F 3/0416 |
| 2018/0035542 | A1* | 2/2018 | Osawa | H05K 1/144 |
| 2019/0137836 | A1* | 5/2019 | Imazeki | G02F 1/136286 |

* cited by examiner

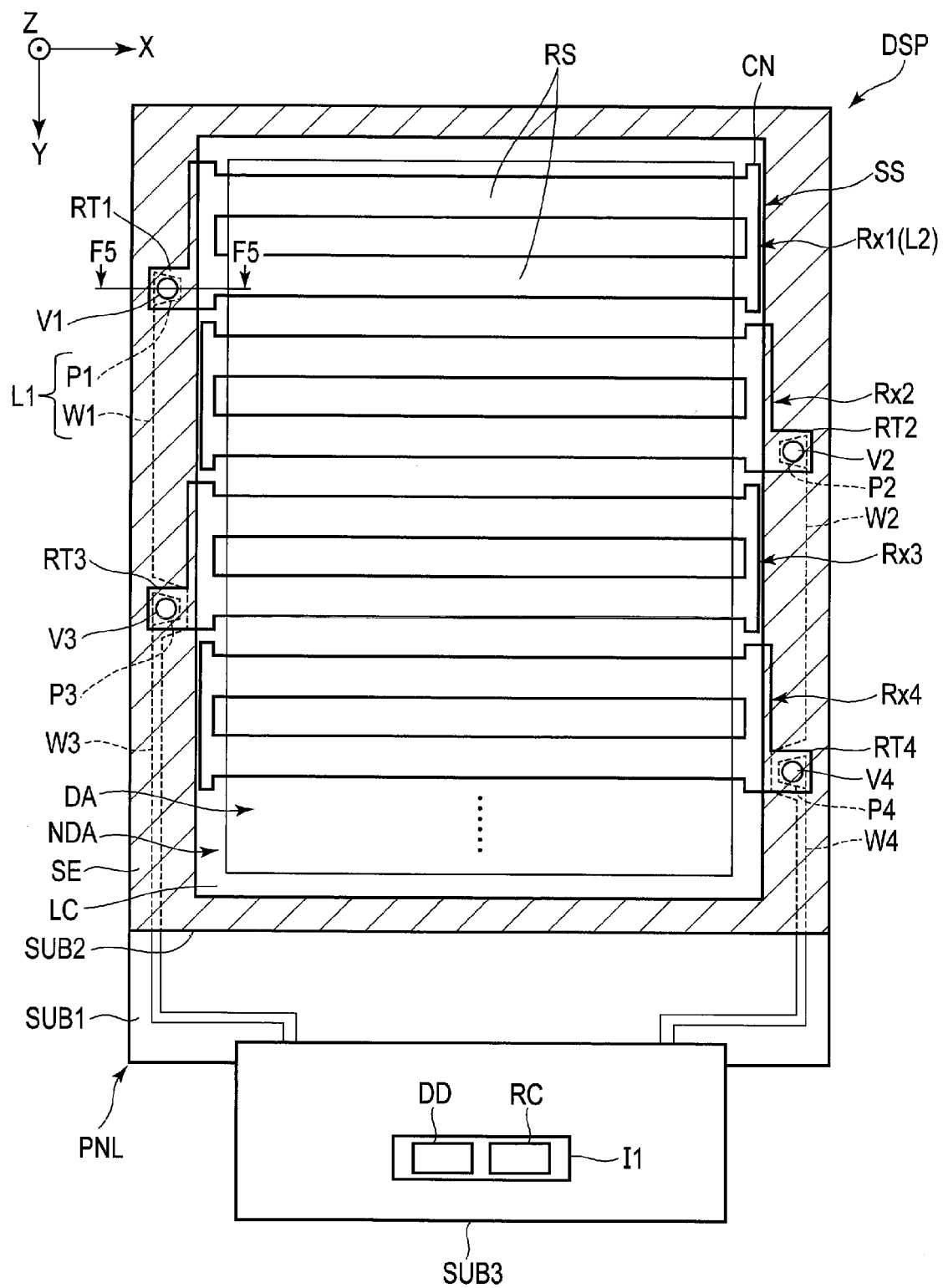
F I G. 1

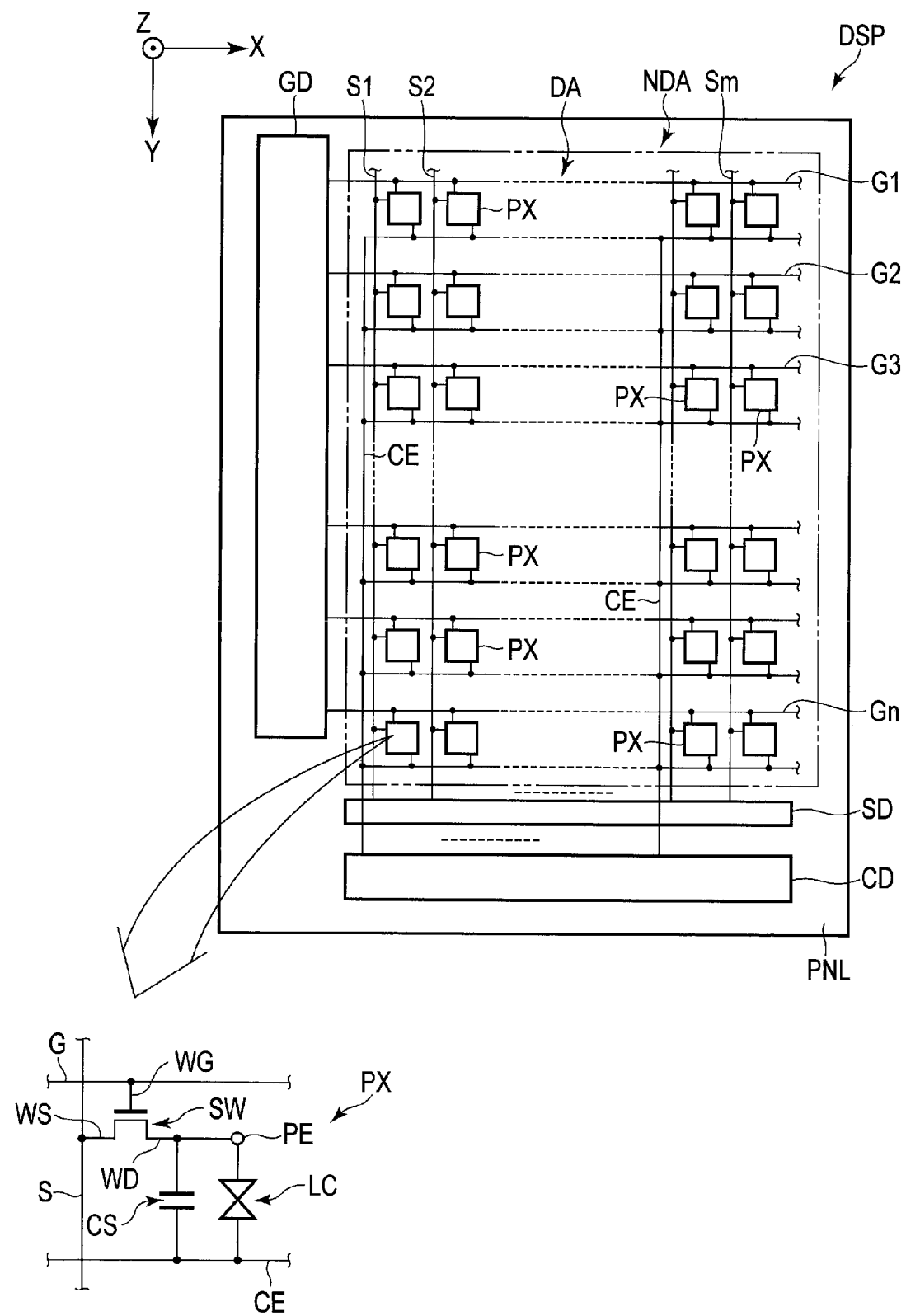
F I G. 2

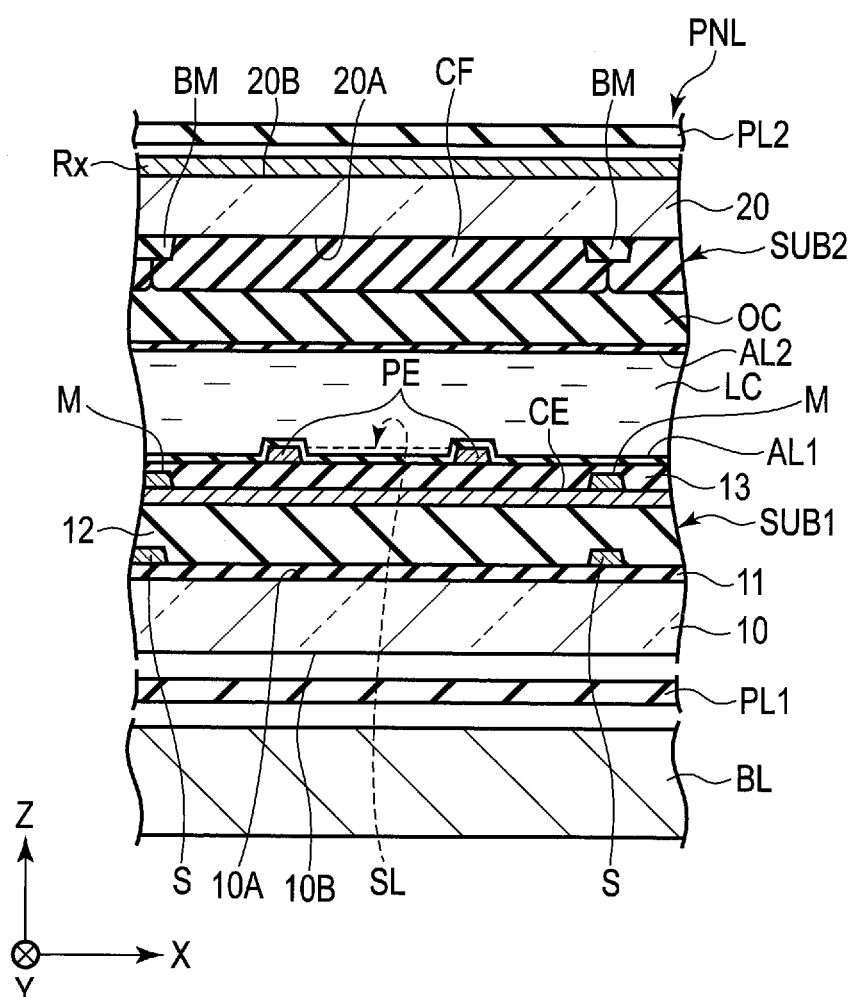
F I G. 3

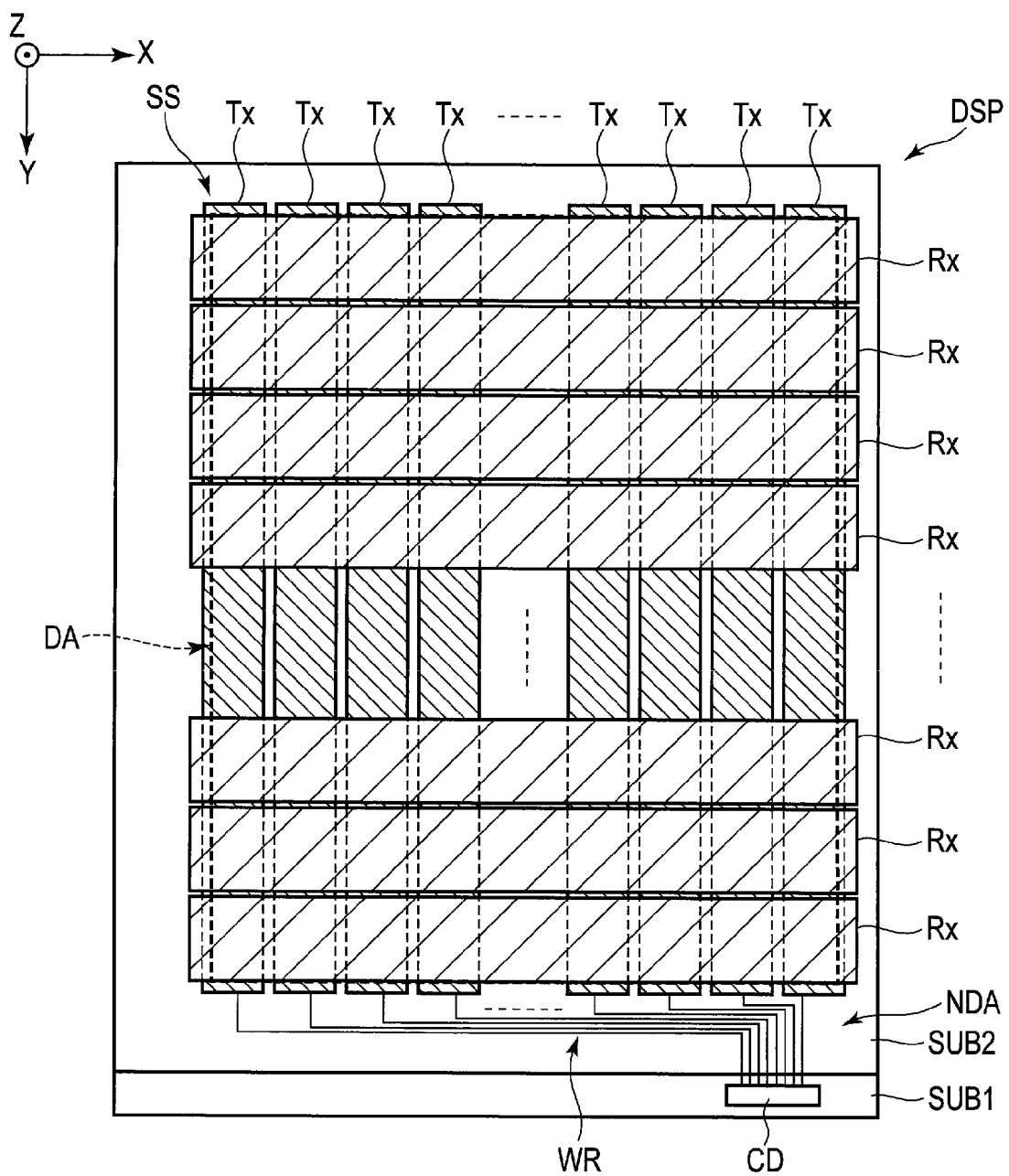
F I G. 4

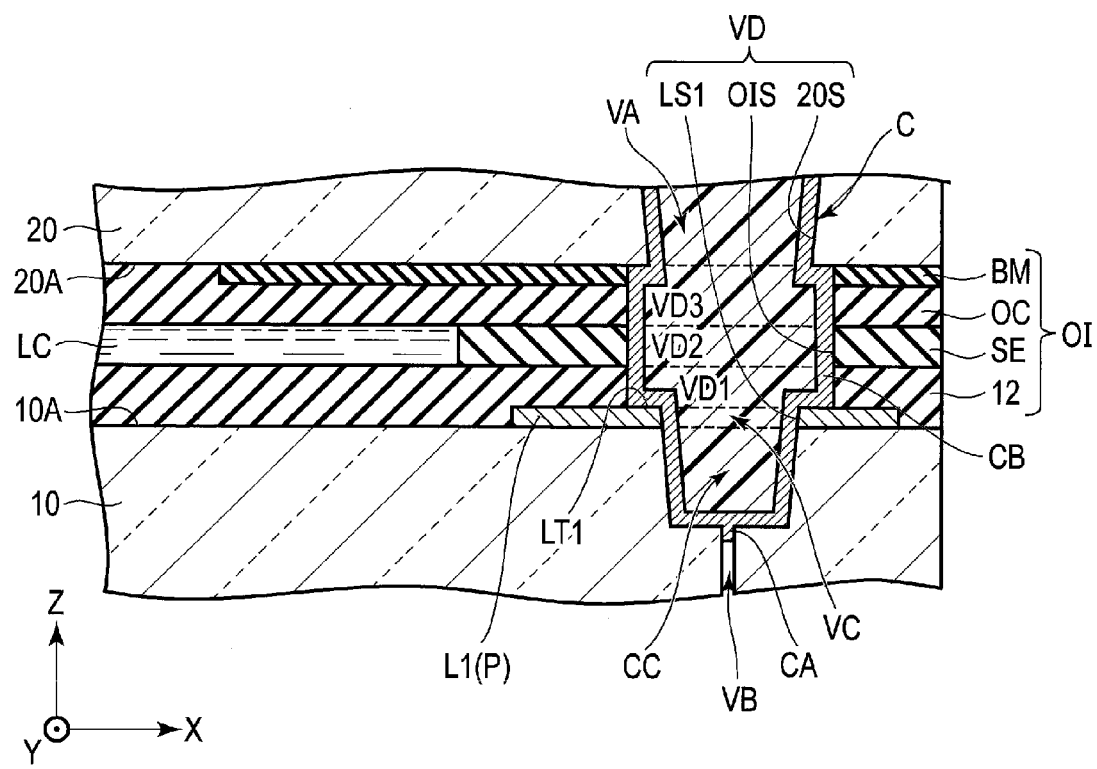
F I G. 6

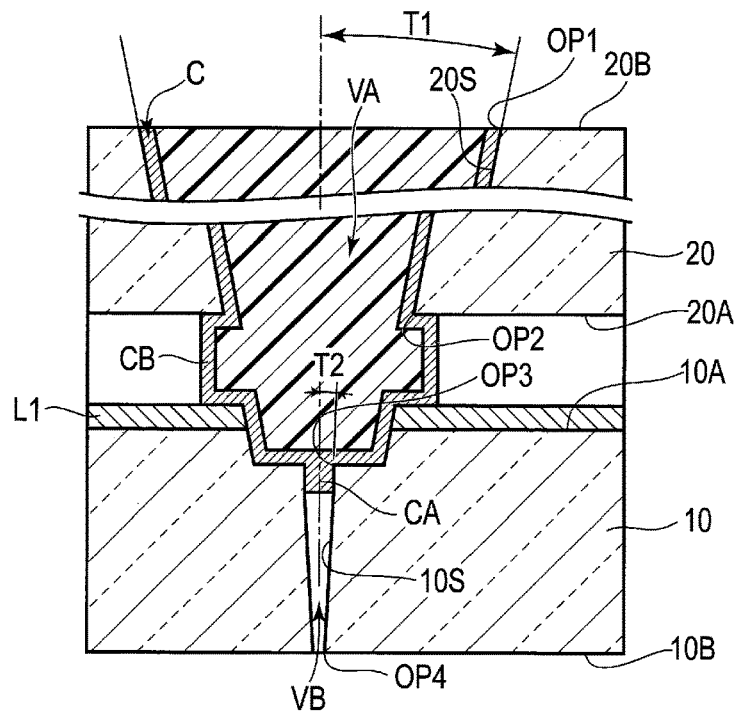
F I G. 7
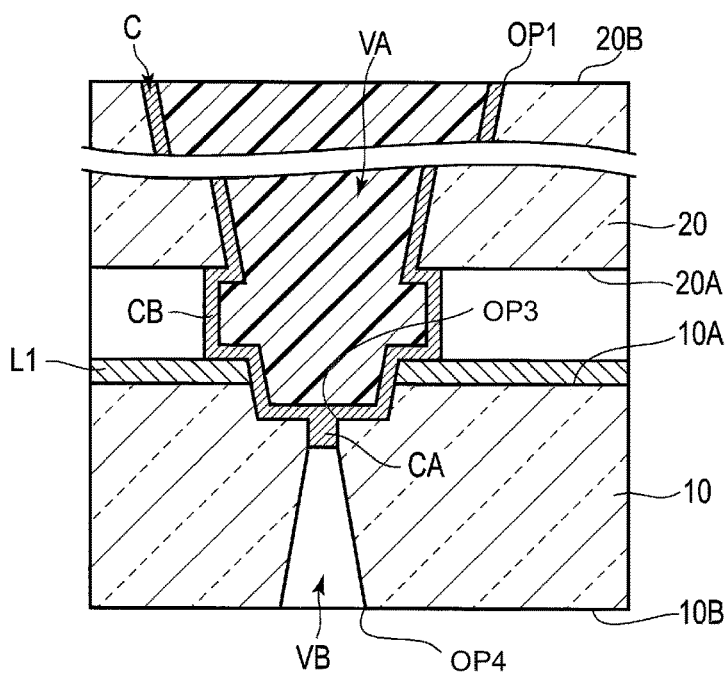
F I G. 8

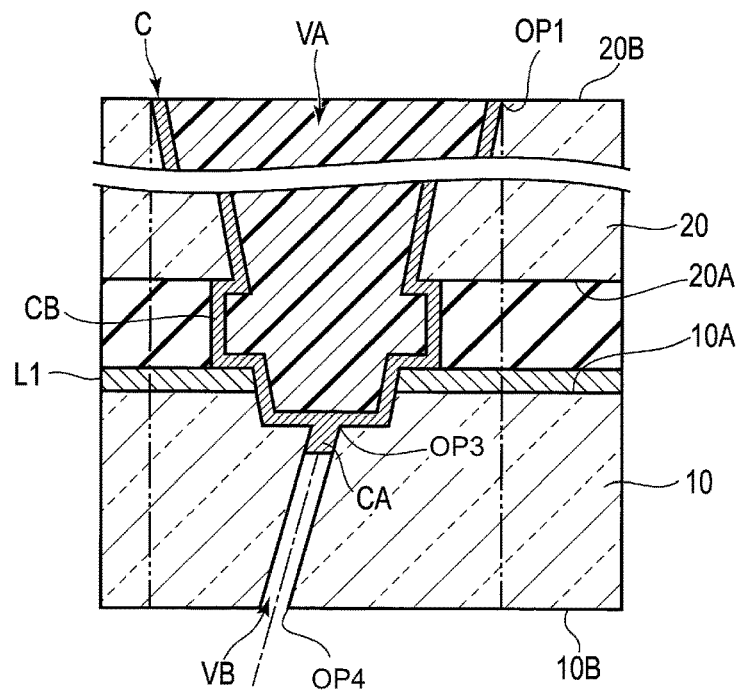
F I G. 9
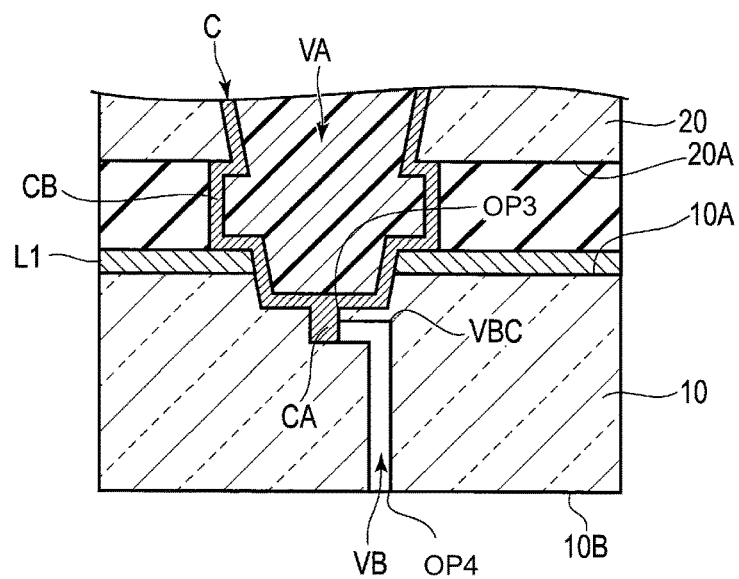
F I G. 10

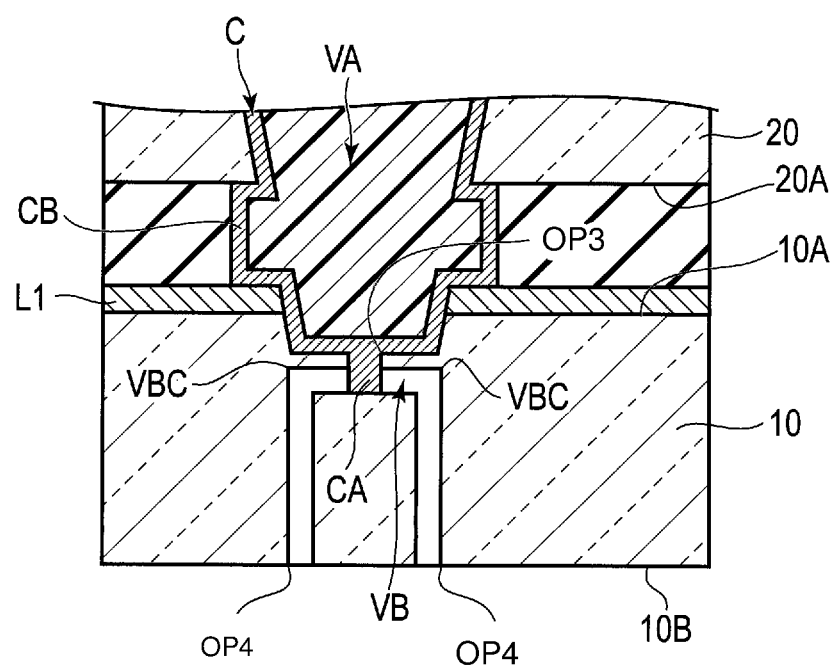
F I G. 11

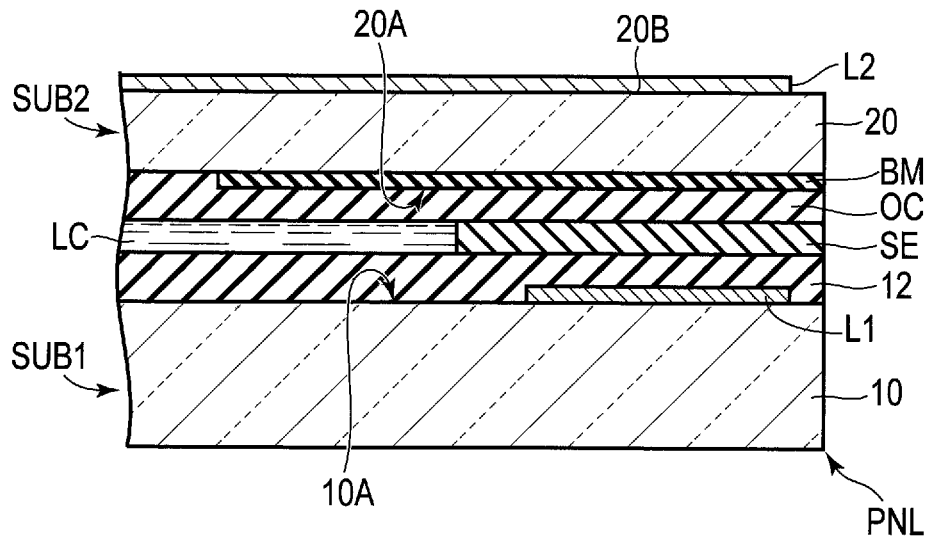
F I G. 14
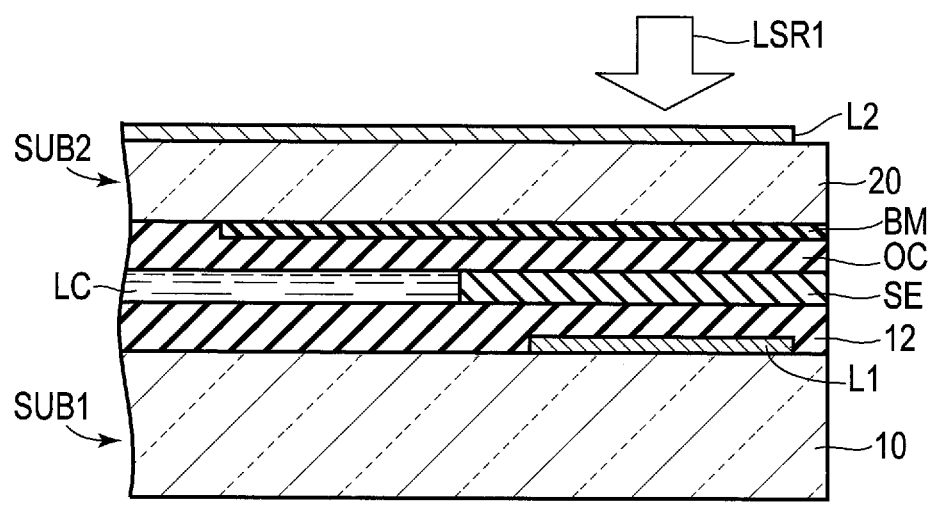
F I G. 15

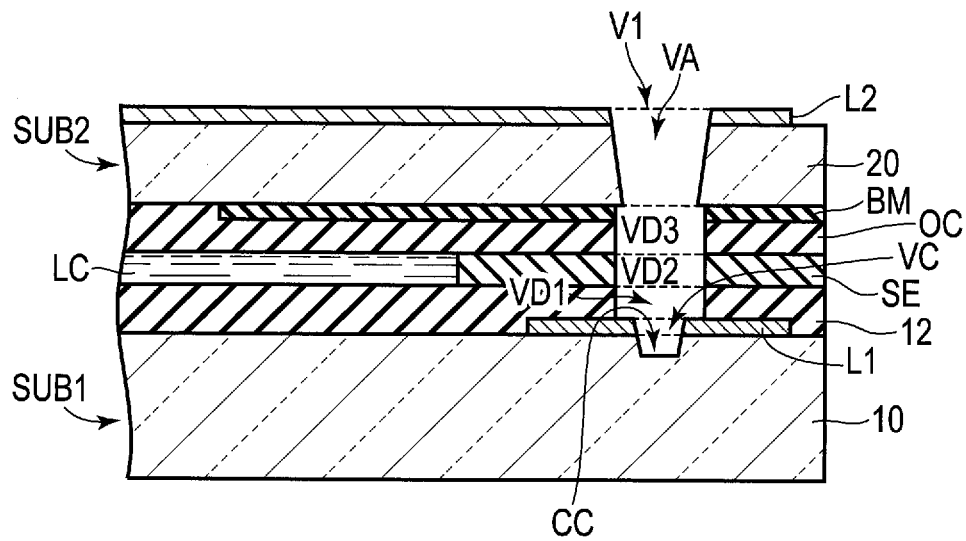
F I G. 16
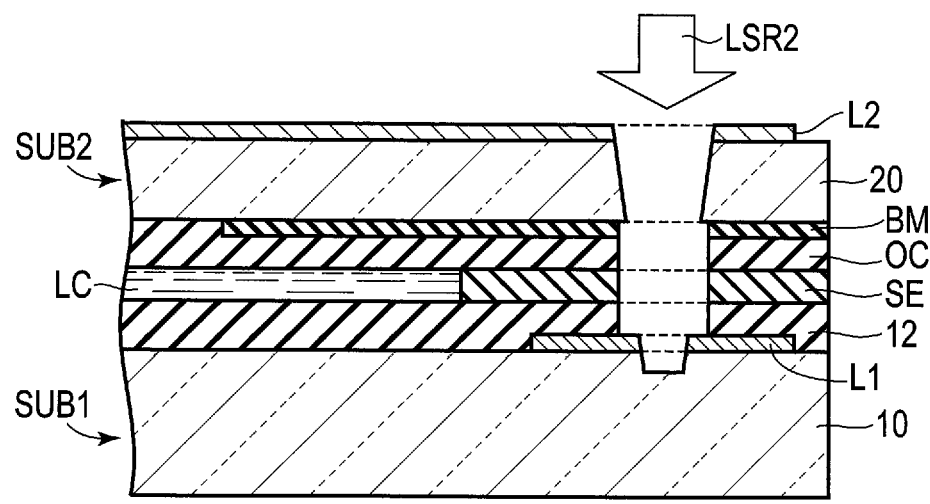
F I G. 17

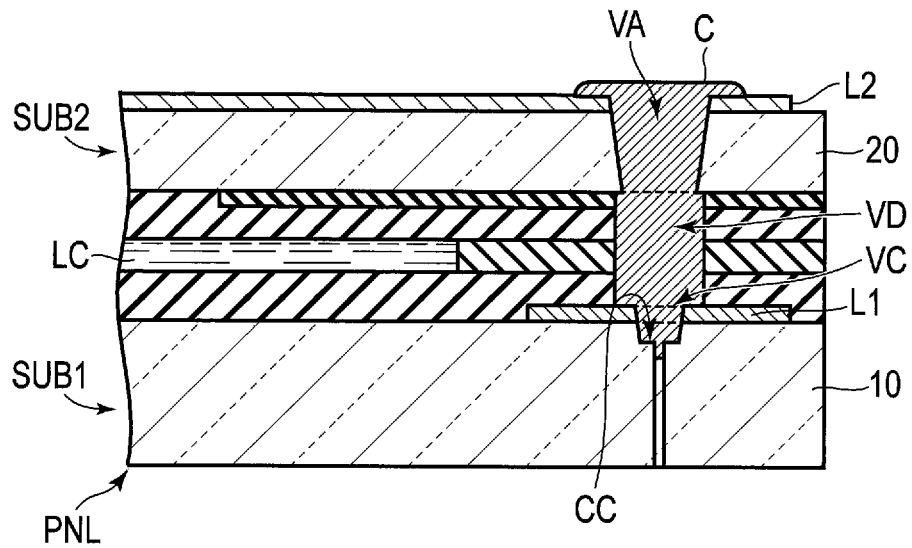
F I G. 20
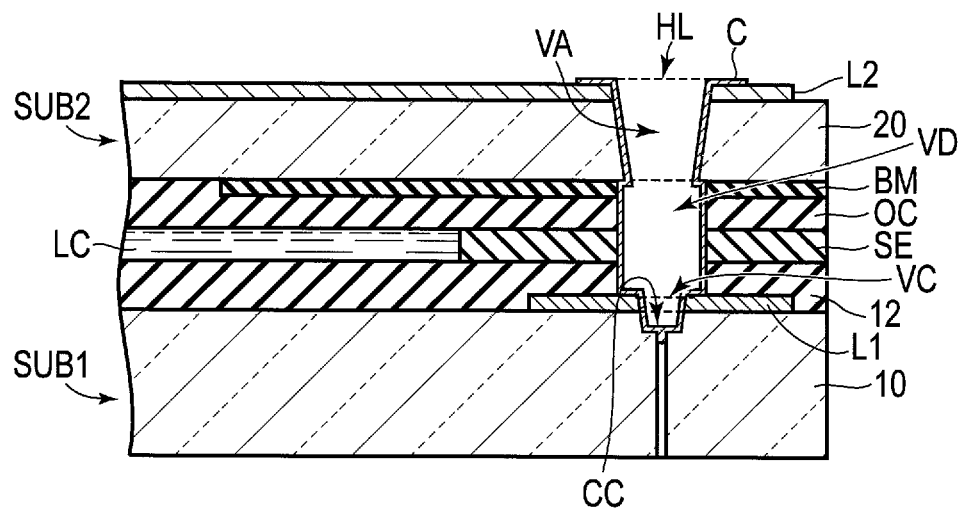
F I G. 21

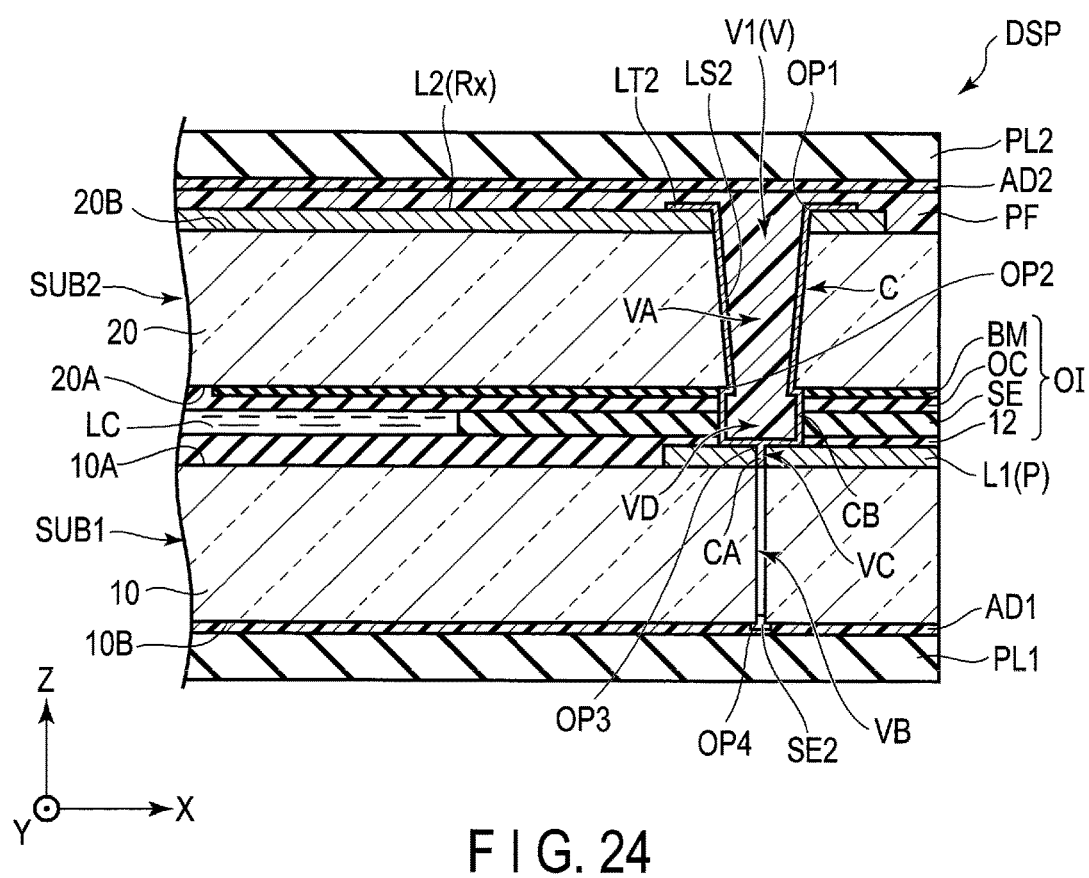
F I G. 24

ELECTRONIC APPARATUS AND METHOD FOR MANUFACTURING THE SAME

CROSS-REFERENCE TO RELATED APPLICATIONS

This application is based upon and claims the benefit of priority from Japanese Patent Application No. 2016-149610, filed Jul. 29, 2016, the entire contents of which are incorporated herein by reference.

FIELD

Embodiments described herein relate generally to an electric apparatus and method for manufacturing the same.

BACKGROUND

In an electronic apparatus, a demand for high efficiency and low cost of wiring mounting has been further increased. For example, in a display device which is an example of an electronic apparatus, various techniques have been studied for narrowing a frame of the display device. For example, a technique that electrically connects a wiring portion having an in-hole connector provided inside a hole penetrating an inner surface and an outer surface of a first substrate formed of a resin and a wiring portion provided on an inner surface of a second substrate formed of a resin by an inter-substrate connector is disclosed (for example, JP 2002-40465 A).

SUMMARY

The present disclosure relates generally to an electric apparatus and method for manufacturing the same. In an embodiment, an electronic apparatus is provided. The electronic apparatus includes a first substrate including a first basement and a first conductive layer; a second substrate including a second basement and a second conductive layer; and a connecting material electrically connecting the first conductive layer and the second conductive layer, wherein the first basement includes a first surface and a second surface opposite to the first surface, the first conductive layer is located over the first surface, the second basement includes a third surface, a fourth surface opposite to the third surface, and a first hole penetrating the second basement, the third surface is opposed to the first conductive layer and spaced apart from the first conductive layer, the second conductive layer is located on the fourth surface, the first hole includes a first opening formed on the fourth surface and a second opening formed on the third surface, the connecting material contacts the first conductive layer and the second conductive layer via the first hole, the first basement further includes a second hole that penetrates the first basement and connects to the first hole, and the second hole includes a third opening that is smaller than the first opening and is opposed to the second opening and a fourth opening that is formed on the second surface. In another embodiment, a method for manufacturing an electronic apparatus is provided. The method includes preparing a first substrate including a first basement and a first conductive layer and a second substrate including a second basement and a second conductive layer, the second basement being opposed to the first conductive layer and spaced apart from the first conductive layer; forming a first hole penetrating the second basement, forming a second hole penetrating the first basement, and forming a connecting material electrically connecting between the first conductive layer and the second conductive layer in the first hole by filling the first hole with a conductive material. Additional features and advantages are described herein, and will be apparent from the following Detailed Description and the figures.

BRIEF DESCRIPTION OF THE DRAWINGS

FIG. 1 is a plan view illustrating a configuration example of a display device DSP of a first embodiment;

FIG. 2 is a plan view schematically illustrating a basic configuration and an equivalent circuit of the display panel PNL illustrated in FIG. 1;

FIG. 3 is a cross-sectional view illustrating a structure of a display area DA of the display panel PNL illustrated in FIG. 1;

FIG. 4 is a plan view illustrating a configuration example of a sensor SS according to the first embodiment;

FIG. 6 is an enlarged cross-sectional view of a fourth hole VD illustrated in FIG. 5;

FIG. 7 is a cross-sectional view illustrating a configuration example of a second hole VB of the first embodiment;

FIG. 8 is a cross-sectional view illustrating another configuration example of the second hole VB of the first embodiment;

FIG. 9 is a cross-sectional view illustrating another configuration example of the second hole VB of the first embodiment;

FIG. 10 is a cross-sectional view illustrating another configuration example of the second hole VB of the first embodiment;

FIG. 11 is a cross-sectional view illustrating another configuration example of the second hole VB of the first embodiment;

FIG. 14 is a cross-sectional view for describing a method for manufacturing a display device DSP of a first embodiment;

FIG. 15 is a cross-sectional view for describing the method for manufacturing a display device DSP subsequent to FIG. 14;

FIG. 16 is a cross-sectional view for describing the method for manufacturing a display device DSP subsequent to FIG. 15;

FIG. 17 is a cross-sectional view for describing the method for manufacturing a display device DSP subsequent to FIG. 16;

FIG. 20 is a cross-sectional view for describing the method for manufacturing a display device DSP subsequent to FIG. 19;

FIG. 21 is a cross-sectional view for describing the method for manufacturing a display device DSP subsequent to FIG. 20;

FIG. 24 is a cross-sectional view illustrating a configuration example of a display device DSP of a second embodiment.

DETAILED DESCRIPTION

Figure 5:
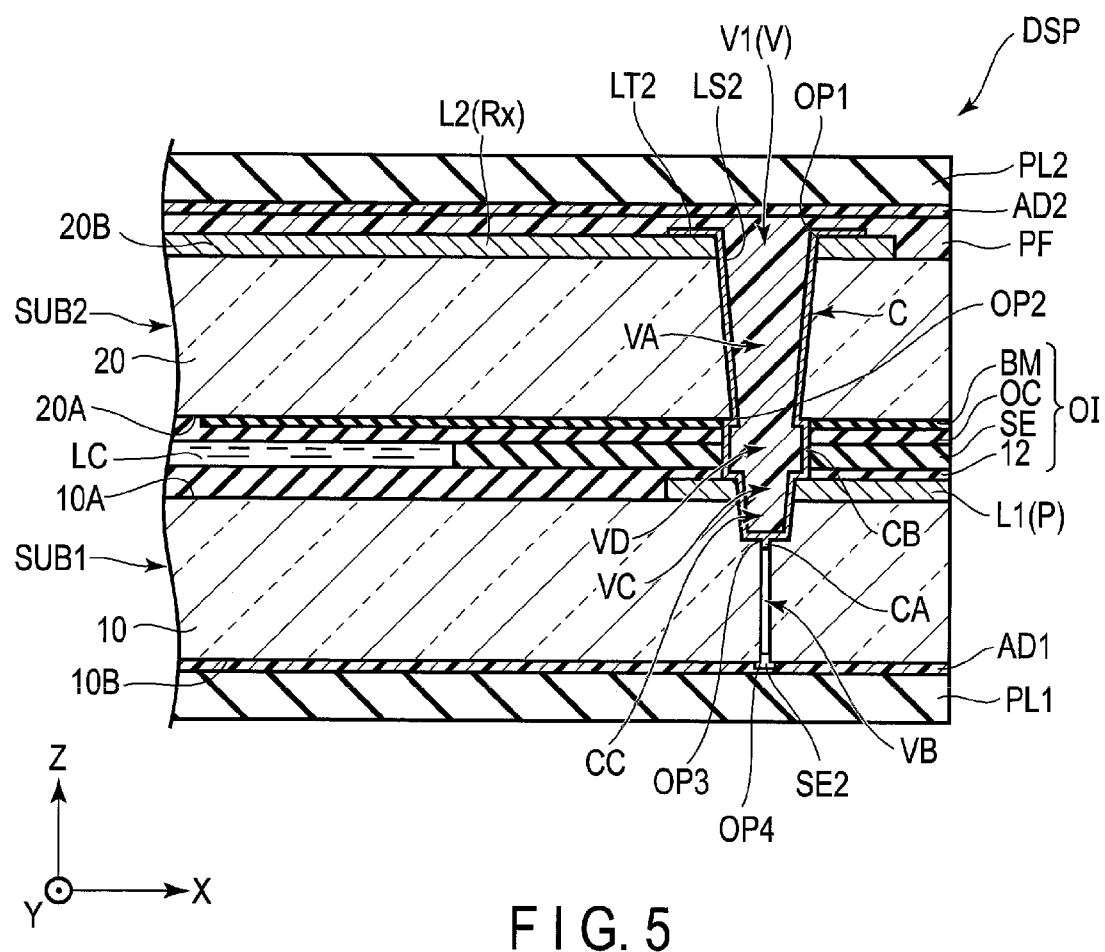
FIG. 5 is a cross-sectional view taken along line F5-F5 in FIG. 1.

In general, according to one embodiment, an electronic apparatus includes a first substrate, a second substrate, and a connecting material. The first substrate includes a first basement and a first conductive layer. The first substrate has a first main surface on which a first conductive layer is provided and a second main surface. The second substrate includes a second basement and a second conductive layer. The second basement has a third main surface opposed to the first conductive layer and a fourth main surface and is spaced apart from the first conductive layer. The second substrate has a first hole penetrating the second basement. The first substrate has a second hole that penetrates the first basement and connects to the first hole. A third opening of the second hole is smaller than a first opening of the first hole. A connecting material is filled in the first hole and electrically connects the first conductive layer and the second conductive layer via the first hole.

In addition, according to one embodiment, a method for manufacturing an electronic apparatus includes preparing a first substrate including a first substrate and a first conductive layer and a second conductive layer including a second substrate and a second conductive layer. The second substrate is opposed to the first conductive layer and is spaced apart from the first conductive layer. The second substrate is provided with a first through hole penetrating the second substrate. The first substrate is provided with a second through hole penetrating the first substrate. The first through hole is filled with a conductive material, such that the first through hole is provided with a connection member that electrically connects the first conductive layer and the second conductive layer.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, and the like of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

In each embodiment, a display device is disclosed as an example of an electronic device. The display device can be used for various devices such as a smart phone, a tablet terminal, a mobile phone terminal, a notebook type personal computer, and a game machine. Main components disclosed in each embodiment can be applied to a liquid crystal display device, a self-luminous display device such as an organic electroluminescence display device, an electronic paper type display device having an electrophoretic element and the like, a display device to which micro electro mechanical systems (MEMS) is applied, or a display device to which electrochromism is applied, and the like.

Further, the electronic device is not limited to the display device, and may be, for example, an external type touch panel substrate that is overlaid and attached on the display device. The present invention can be applied to various electronic devices including an inter-substrate conducting structure in which a first basement and a second basement are disposed to be spaced apart from each other, the second basement has a first hole, a first conductive layer located on the first basement and a second conductive layer located on the second substrate are electrically connected to each other via the first hole.

First Embodiment

FIG. 1 is a plan view illustrating an example of a display device DSP of a first embodiment. A first direction X, a second direction Y, and a third direction Z are orthogonal to each other, but may intersect with each other at an angle other than 90 degrees. The first direction X and the second direction Y correspond to a direction parallel to a main surface of a substrate configuring a display device DSP and the third direction Z corresponds to a thickness direction of the display device DSP. Here, as an example of the display device DSP, a liquid crystal display device equipped with a sensor SS will be described.

The display device DSP includes a display panel PNL, an IC chip I1, a wiring substrate SUB3 or the like. The display panel PNL is a liquid crystal panel, and includes a first substrate SUB1, a second substrate SUB2, a seal SE, and a liquid crystal layer LC. The second substrate SUB2 is opposed to the first substrate SUB1 in the third direction Z. The seal SE corresponds to a portion indicated diagonally upward right in FIG. 1 and adheres the first substrate SUB1 to the second substrate SUB2. The liquid crystal layer LC is disposed between the first substrate SUB1 and the second substrate SUB2 at an inner side of the seal SE.

In the following description, a direction from the first substrate SUB1 toward the second substrate SUB2 is referred to as an upward direction and a direction from the second substrate SUB2 toward the first substrate SUB1 is referred to as a downward direction. In addition, what is viewed from the second substrate SUB2 toward the first substrate SUB1 is referred to as a plan view.

The display panel PNL includes a display area DA that displays an image and a frame-like non-display area NDA surrounding the display area DA. The display area DA is an example of a first area and is located inside an area surrounded by the seal SE. The non-display area NDA is an example of a second area and is adjacent to the display area DA. The seal SE is located in the non-display area NDA.

The wiring substrate SUB3 is mounted on the first substrate SUB1. The wiring substrate SUB3 is, for example, a flexible substrate having flexibility. It should be noted that the flexible substrate applicable in the present embodiment may include a flexible portion formed of a bendable material formed in at least a part thereof. In other words, the wiring substrate SUB3 may be a flexible substrate the whole of which is configured as a flexible portion, and may be a rigid flexible substrate including a rigid portion formed of hard materials such as glass epoxy and a flexible portion formed of bendable materials such as polyimide.

The IC chip I1 is mounted over the wiring substrate SUB3. The IC chip I1 is not limited to the example illustrated in FIG. 1, but the IC chip I1 may be mounted over the first substrate SUB1 extending outwardly of the second substrate SUB2, or may be mounted over an external circuit board connected to the wiring substrate SUB3. The IC chip I1 includes, for example, a display driver DD that outputs a signal necessary for displaying an image. The display driver DD includes, for example, at least one of a signal line drive circuit SD, a scanning line drive circuit GD, and a common electrode drive circuit CD which will be described below. In addition, in the example illustrated in FIG. 1, the IC chip I1 includes a detection circuit RC that serves as a touch panel controller or the like. The detection circuit RC may be built in another IC chip different from the IC chip I1.

The display panel PNL may be, for example, a transmissive type having a transmissive display function of selectively transmitting light from a lower side of the first substrate SUB1 to display an image, or may be a reflective type having a reflective display function of selectively reflecting light from an upper side of the second substrate SUB2 to display an image. Alternatively, the display panel PNL may be a transflective type having the transmissive display function and the reflective display function.

The sensor SS performs sensing for detecting a contact or approach of an object to the display device DSP. The sensor SS is provided with a plurality of detection electrodes Rx (Rx1, Rx2, Rx3, Rx4, . . . ). The detection electrode Rx is provided on the second substrate SUB2. Each detection electrode Rx extends in the first direction X and is arranged at intervals in the second direction Y. The detection electrode Rx includes a detector RS and a connector CN. In addition, each detection electrode Rx has a terminal RT (RT1, RT2, RT3, RT4, . . . ).

The detector RS is located in the display area DA and extends in the first direction X. In the detection electrode Rx, the detector RS is mainly used for sensing. As an example, the detector RS can be formed into a stripe shape by an aggregate of fine metal wires. In addition, in the example illustrated in FIG. 1, one detection electrode Rx includes two detectors RS, but three or more detectors RS may be provided, or one detector RS may be provided.

The terminal RT is located on one end side of the non-display area NDA along the first direction X and is connected to the detector RS. The connector CN is located on one end side and the other end side of the non-display area NDA along the first direction X, and connects the plurality of detectors RS to each other, and at the same time, is connected to the terminal RT. In FIG. 1, one end side corresponds to a left side of the display area DA and the other end side corresponds to a right side of the display area DA. A part of the terminal RT is formed at a location overlaying the seal SE in planar view.

The first substrate SUB1 includes pads P (P1, P2, P3, P4, . . . ) and wiring lines W (W1, W2, W3, W4, . . . ). The pad P and the wiring line W are located at one end side or the other end side of the non-display area NDA and overlay the seal SE in planar view. The pad P is formed at a location overlaying the terminal RT in planar view. The wiring line W is connected to the pad P, extends along the second direction Y, and is electrically connected to the detection circuit RC of the IC chip I1 via the wiring substrate SUB3.

The contact hole V (V1, V2, V3, V4, . . . ) is formed at a location where the terminal RT and the pad P are opposed to each other. In addition, the contact hole V may penetrate through the pad P, simultaneously with penetrating the second substrate SUB2 including the terminal RT and the seal SE. In the example illustrated in FIG. 1, the contact hole V has a circular shape in planar view, but it is not limited thereto, and may have other shapes such as an ellipse. The terminal RT is formed slightly larger than the contact hole V. In the example illustrated in FIG. 1, the terminal RT has a circular shape, but it is not limited thereto, and may have other shapes such as an octagon.

The contact hole V is provided with a connecting material C to be described below, and the terminal RT of the detection electrode Rx and the pad P are electrically connected to each other via the connecting material C. The detection electrode Rx is an example of the second conductive layer L2 provided on the second substrate SUB2 that is spaced apart from the first substrate SUB1, and the pad P and the wiring line W are an example of the first conductive layer L1 provided on the first substrate SUB1.

The detection electrode Rx connected to the pad P is electrically connected to the detection circuit RC via the wiring substrate SUB3 connected to the first substrate SUB1. The detection circuit RC reads a sensor signal output from the detection electrode Rx and detects the presence or absence of the contact or approach of the object, the location coordinate of the object or the like.

In the example illustrated in FIG. 1, all of the terminal RT (RT1, RT3, . . . ), the pad P (P1, P3, . . . ), the wiring line W (W1, W3, . . . ), and the contact hole V (V1, V3, . . . ) of each of the odd-numbered detection electrodes Rx (Rx1, Rx3, . . . ) are located on one end side of the non-display area NDA. In contrast, all of the terminal RT (RT2, RT4, . . . ), the pad P (P2, P4, . . . ), the wiring line W (W2, W4, . . . ), and the contact hole V (V2, V4, . . . ) of each of the even-numbered detection electrodes Rx (Rx2, Rx4, . . . ) are located on the other end side opposite to the one end side of the non-display area NDA. According to the layout, a width of the one end side and a width of the other end side in the non-display area NDA can be uniform, which is suitable for narrowing the frame.

As illustrated in FIG. 1, in the layout in which the pad P3 is closer to the wiring substrate SUB3 than the pad P1, the wiring line W1 bypasses an inner side of the pad P3, that is, a side close to the display area DA, and are disposed in parallel inside the wiring line W3 between the pad P3 and the wiring substrate SUB3. Likewise, the wiring line W2 bypasses an inner side of the pad P4 and is disposed in parallel inside the wiring line W4 between the pad P4 and the wiring substrate SUB3.

FIG. 2 is a plan view schematically illustrating a basic configuration and an equivalent circuit of the display panel PNL illustrated in FIG. 1.

The display panel PNL includes a plurality of pixels PX in the display area DA. Here, a pixel indicates a minimum unit that can be individually controlled according to a pixel signal, and exists in, for example, a region including a switching element disposed at a location where a scanning line and a signal line to be described below intersect each other. The pixels PX are arrayed in a matrix in the first direction X and the second direction Y. In addition, the display panel PNL includes a plurality of scanning lines G (G1 to Gn), a plurality of signal lines S (S1 to Sm), a common electrode CE or the like in the display area DA.

Each scanning line G extends in the first direction X and is arranged in the second direction Y. Each signal line S extends in the second direction Y and is arranged in the first direction X. It should be noted that the scanning line G and the signal line S may not necessarily extend linearly, and a part thereof may be bent. The common electrode CE is arranged over the pixels PX.

The scanning line the signal line S, and the common electrode CE are each led out to the non-display area NDA. In the non-display area NDA, the scanning line G is connected to the scanning line drive circuit GD, the signal line S is connected to the signal line drive circuit SD, and the common electrode CE is connected to the common electrode drive circuit CD. The signal line drive circuit SD, the scanning line drive circuit GD, and the common electrode drive circuit CD may be formed on the first substrate SUB1, and a part or all of them are built in the IC chip I1 illustrated in FIG. 1.

Each pixel PX includes a switching element SW, a pixel electrode PE, a common electrode CE, a liquid crystal layer LC or the like. The switching element SW is formed of, for example, a thin film transistor (TFT) and is electrically connected to the scanning line G and the signal line S. More specifically, the switching element SW includes a gate electrode WG, a source electrode WS, and a drain electrode WD. The gate electrode WG is electrically connected to the scanning line G. In the example illustrated in FIG. 2, the electrode electrically connected to the signal line S is the source electrode WS, and the electrode electrically connected to the pixel electrode PE is the drain electrode WD.

The scanning line G is connected to the switching element SW in each of the pixels PX arranged in the first direction X. The signal line S is connected to the switching element SW in each of the pixels PX arranged in the second direction Y. Each of the pixel electrodes PE is opposed to the common electrode CE and drives the liquid crystal layer LC by an electric field generated between the pixel electrode PE and the common electrode CE. A storage capacitor CS is formed, for example, between the common electrode CE and the pixel electrode PE.

FIG. 3 is a cross-sectional view of the display device DSP taken along the first direction X in the display area DA. In the example illustrated in FIG. 3, the display panel PNL mainly has a configuration corresponding to a display mode using a horizontal electric field substantially parallel to an X-Y plane. It should be noted that the display panel PNL may have a configuration corresponding to a vertical electric field perpendicular to the X-Y plane, an inclined electric field to the X-Y plane, or a display mode that uses a combination of the electric fields.

In the display mode using the horizontal electric field, for example, a configuration in which either the first substrate SUB1 or the second substrate SUB2 is provided with both of the pixel electrode PE and the common electrode CE can be applied. In the display mode using the vertical electric field or the inclined electric field, for example, a configuration in which the first substrate SUB1 is provided with any one of the pixel electrode PE and the common electrode CE and the second substrate SUB2 is provided with the other of the pixel electrode PE and the common electrode CE can be applied.

The first substrate SUB1 includes the first basement 10, the signal line S, the common electrode CE, a metal layer M, the pixel electrode PE, a first insulating layer 11, a second insulating layer 12, a third insulating layer 13, a first alignment film AL1 or the like. The first basement 10 has a first main surface 10A that is opposed to the second substrate SUB2 and a second main surface 10B opposite to the first main surface 10A. In FIG. 3, the switching elements, the scanning lines, various insulating layers interposed therebetween or the like are omitted.

The first insulating layer 11 is located on the first main surface 10A of the first basement 10. The scanning line or a semiconductor layer of a switching element that is not shown is located between the first basement 10 and the first insulating layer 11. The signal line S is located over the first insulating layer 11. The second insulating layer 12 is located over the signal line S and the first insulating layer 11. The common electrode CE is located over the second insulating layer 12.

The metal layer M comes into contact with the common electrode CE directly above the signal line S. In the example illustrated in FIG. 3, the metal layer M is located over the common electrode CE, but it may be located between the common electrode CE and the second insulating layer 12. The third insulating layer 13 is located over the common electrode CE and the metal layer M. The pixel electrode PE is located over the third insulating layer 13. The pixel electrode PE is opposed to the common electrode CE via the third insulating layer 13. In addition, the pixel electrode PE has a slit SL at a location where the pixel electrode PE is opposed to the common electrode CE. The first alignment film AL1 covers the pixel electrode PE and the third insulating layer 13.

The scanning line the signal line S, and the metal layer M are formed of metal materials such as molybdenum, tungsten, titanium, and aluminum. It should be noted that the scanning line the signal line S, and the metal layer M may have a single layer structure or a multilayer structure. The common electrode CE and the pixel electrode PE are formed of transparent conductive materials such as indium tin oxide (ITO) or indium zinc oxide (IZO). The first insulating layer 11 and the third insulating layer 13 are inorganic insulating layers and the second insulating layer 12 is an organic insulating layer.

It should be noted that the configuration of the first substrate SUB1 is not limited to the example illustrated in FIG. 3, and the pixel electrode PE may be located between the second insulating layer 12 and the third insulating layer 13 and the common electrode CE may be located between the third insulating layer 13 and the first alignment film AL1. In such a case, the pixel electrode PE is formed in a flat plate shape without a slit, and the common electrode CE has a slit opposed to the pixel electrode PE. In addition, both the pixel electrode PE and the common electrode CE may be formed in a comb shape and may be disposed so as to be engaged with each other.

The second substrate SUB2 includes a second basement 20, a light-shielding layer BM, a color filter CF, an overcoat layer OC, a second alignment film AL2 or the like. The second basement 20 has a third main surface 20A opposed to the first substrate SUB1 and a fourth main surface 20B opposite to the third main surface 20A.

The light-shielding layer BM and the color filter CF are located over the third main surface 20A of the second basement 20. The light-shielding layer BM partitions each pixel and is located directly above the signal line S. The color filter CF is opposed to the pixel electrode PE, and a part thereof overlays the light-shielding layer BM. The color filter CF includes a red color filter, a green color filter, a blue color filter or the like. The overcoat layer OC covers the color filter CF. The second alignment film AL2 covers the overcoat layer OC.

It should be noted that the color filter CF may be disposed on the first substrate SUB1. The color filter CF may include color filters for four or more colors. A pixel displaying white may be provided with a white color filter, provided with an uncolored resin material, or provided with the overcoat layer OC without being provided with the color filter.

A first polarizer PL1 is located between the first basement 10 and an illumination device BL. A second polarizer PL2 is located over the detection electrode Rx that is provided over the fourth main surface 20B of the second basement 20. It should be noted that the first polarizer PL1 and the second polarizer PL2 may be additionally provided with a retardation film or the like, if necessary.

A configuration example of the sensor SS mounted over the display device DSP of the present embodiment will be described with reference to FIG. 4. The sensor SS illustrated in FIG. 4 is, for example, a mutual-capacitive electrostatic capacitance type, and can detect a contact or an approach of an object based on a change in electrostatic capacitance between a pair of electrodes opposed to each other via a dielectric. The sensor SS is, for example, an in-cell type touch panel.

The sensor SS includes a sensor driving electrode Tx and the detection electrode Rx. In the example illustrated in FIG. 4, the sensor driving electrode Tx corresponds to a portion indicated diagonally downward right and is provided on the first substrate SUB1. In addition, the detection electrode Rx corresponds to a portion indicated diagonally upward right and is provided on the second substrate SUB2. The sensor driving electrode Tx and the detection electrode Rx intersect with each other in the X-Y plane. The detection electrode Rx is opposed to the sensor driving electrode Tx in the third direction Z.

The sensor driving electrode Tx and the detection electrode Rx are located in the display area DA, and a part of the sensor driving electrode Tx and the detection electrode Rx extends to the non-display area NDA. In the example illustrated in FIG. 4, each of the sensor driving electrodes Tx has a stripe shape extending in the second direction Y, and the sensor driving electrodes Tx are arranged at intervals in the first direction X. Each of the detection electrodes Rx extends in the first direction X and the detection electrodes Rx are arranged at intervals in the second direction Y. The detection electrode Rx is electrically connected to the pad P by the inter-substrate conducting structure and is connected to the detection circuit RC via the wiring line W.

Each of the sensor driving electrodes Tx is electrically connected to the common electrode drive circuit CD via the wiring line W. It should be noted that the number, size and shape of the sensor driving electrodes Tx and the detection electrodes Rx are not particularly limited, and can be variously changed. The sensor driving electrode Tx includes the above-mentioned common electrode CE and serves to generate an electric field between the sensor driving electrode Tx and the pixel electrode PE and generate capacitance between the sensor driving electrode Tx and the detection electrode Rx to detect a location of an object.

The common electrode drive circuit CD supplies a common drive signal to the sensor driving electrode Tx including the common electrode CE during display driving for displaying an image in the display area DA. In addition, the common electrode drive circuit CD supplies a sensor drive signal to the sensor driving electrode Tx during sensing driving for sensing. As the sensor drive signal is supplied to the sensor driving electrode Tx, the detection electrode Rx outputs a sensor signal necessary for sensing, in other words, a signal based on a change in inter-electrode capacitance between the sensor driving electrode Tx and the detection electrode Rx. The detection signal output from the detection electrode Rx is input to the detection circuit RC illustrated in FIG. 1.

It should be noted that the sensor SS is not limited to the mutual capacitive type of detecting an object based on the electrostatic capacitance between the pair of electrodes, that is, the change in the electrostatic capacitance between the sensor driving electrode Tx and the detection electrode Rx, and may be a self-capacitive type that detects an object based on a change in capacitance of the detection electrode Rx itself.

Next, the above-mentioned contact hole V (V1, V2, V3, V4, . . . ) will be described. FIG. 5 is a schematic cross-sectional view of the display device DSP taken along the line F5-F5 in FIG. 1.

In the example illustrated in FIG. 5, in the inter-substrate conducting structure provided in the non-display area NDA, the display device DSP includes the first substrate SUB1, the second substrate SUB2, an organic insulating layer OI, a protective film PF, the connecting material C, the first polarizer PL1, and the second polarizer PL2. The first polarizer PL1 adheres to the first substrate SUB1 by an adhesive layer AD1. The second polarizer PL2 adheres to the second substrate SUB2 by an adhesive layer AD2.

The first substrate SUB1 includes the above-mentioned first basement 10 and the first conductive layer L1. The first conductive layer L1 includes the pad P (P1, P2, P3, P4, . . . ) or the wiring line W (W1, W2, W3, W4, . . . ) that are described above and is located over the first main surface 10A side opposed to the second substrate SUB2. The first insulating layer 11 illustrated in FIG. 3, another insulating layer, or another conductive layer may be disposed between the first basement 10 and the pad P and between the first basement 10 and the second insulating layer 12.

The second substrate SUB2 includes the second basement 20 and the second conductive layer L2 described above. The third main surface 20A of the second basement 20 is opposed to the first conductive layer L1 and is spaced apart from the first conductive layer L1 in the third direction Z. The second conductive layer L2 includes the above-mentioned detection electrode Rx, that is, the terminal RT (RT1, RT2, RT3, RT4, . . . ) or the connector CN. The second conductive layer L2 is located over the fourth main surface 20B side and is covered with the protective film PF. In other words, the first basement 10, the first conductive layer L1, the second basement 20, the second conductive layer L2, and the protective film PF are arranged in the third direction Z in this order.

The material of the first and second basements 10 and 20 is, for example, glass, or more specifically, alkali-free glass. Note that the material may be a flexible resin such as polyimide.

The first and second basements 10 and 20 are substrates formed of alkali-free glass, for example. The first and second conductive layers L1 and L2 are formed of metal materials such as molybdenum, tungsten, titanium, aluminum, silver, copper, and chromium, an alloy in which these metal materials are combined, or transparent conductive materials such as ITO or IZO. The first and second conductive layers L1 and L2 may also have a single layer structure or a multilayer structure.

The organic insulating layer OI is located between the first conductive layer L1 and the second basement 20. Instead of the organic insulating layer OI, an inorganic insulating layer or another conductive layer may be located, or an air layer may be located. It should be noted that various insulating layers or various conductive layers may be disposed between the second basement 20 and the second conductive layer L2 or over the second conductive layer L2.

For example, the organic insulating layer OI includes the seal SE for bonding the first substrate SUB1 and the second substrate SUB2, the second insulating layer 12 of the first substrate SUB1, the light-shielding layer BM and the overcoat layer OC of the second substrate or the like. The seal SE is located between the second insulating layer 12 and the overcoat layer OC. The liquid crystal layer LC is located in a gap between the first substrate SUB1 and the second substrate SUB2 and is surrounded by the seal SE.

It should be noted that the metal layer M, the third insulating layer 13, and the first alignment film AL1 illustrated in FIG. 3 may be interposed between the second insulating layer 12 and the seal SE. The second alignment film AL2 illustrated in FIG. 3 may be interposed between the overcoat layer OC and the seal SE.

In the example illustrated in FIG. 5, the display device DSP includes a first hole VA penetrating the second basement 20, a second hole VB penetrating the first basement 10, a third hole VC penetrating the pad P, a fourth hole VD penetrating various organic insulating layers OI, and a concavity CC formed over the first basement 10. The first hole VA, the third hole VC, the fourth hole VD, and the concavity CC connect to each other to form the above-described contact hole V. The second hole VB allows the contact hole V to connect to the second main surface 10B of the first basement 10.

The first hole VA penetrates the third main surface 20A and the fourth main surface 20B of the second basement 20. In the example illustrated in FIG. 5, the first hole VA penetrates even the second conductive layer L2. The first hole VA allows a first opening OP1 to be formed over the fourth main surface 20B and a second opening OP2 to be formed on the third main surface 20A. The third hole VC penetrates the first conductive layer L1 at the pad P and is opposed to the first hole VA in the third direction Z.

The concavity CC is formed from the first main surface 10A of the first basement 10 toward the second main surface 10B thereof and does not penetrate up to the second main surface 10B thereof. The concavity CC is opposed to the third hole VC in the third direction Z. In one example, the depth of the concavity CC along the third direction Z is about ⅕ to about ½ of a thickness of the first basement 10 in the third direction Z.

FIG. 6 is an enlarged cross-sectional view of the fourth hole VD. In the example illustrated in FIG. 6, the fourth hole VD includes a first portion VD1 penetrating the second insulating layer 12, a second portion VD2 penetrating the seal SE, and a third portion VD3 penetrating the light-shielding layer BM and the overcoat layer OC.

In the example illustrated in FIG. 6, the fourth hole VD is extended in the first direction X as compared with the first and third holes VA and VC. It should be noted that the fourth hole VD extends beyond the first and third holes VA and VC over all directions on the X-Y plane as well as in the first direction X. For this reason, the first conductive layer L1 has an upper surface LT1 that is not covered with the organic insulating layer OI in the vicinity of the third hole VC.

Any of the third and fourth holes VC and VD and the concavity CC is located directly under the first hole VA, and the first hole VA, the fourth hole VD, the third hole VC, and the concavity CC are arranged in the third direction Z in order. The contact hole V can be formed by irradiating laser light or etching from above the second substrate SUB2. The various organic insulating layers OI on which the fourth hole VD is provided are formed from, for example, materials having a melting point lower than that of the second basement 20 on which the first hole VA is provided and the first conductive layer L1 on which the third hole VC is provided. Alternatively, various organic insulating layers OI are formed from materials that are easily etched.

As illustrated in FIG. 5, the connecting material C is disposed in the contact hole V. The connecting material C electrically connects the pad P and the detection electrode Rx via the contact hole V. In the example illustrated in FIG. 5, the connecting material C comes into contact with an upper surface LT2 of the second conductive layer L2 and an inner surface of the first hole VA, respectively, in the second substrate SUB2. It should be noted that the inner surface of the first hole VA is provided with an inner surface LS2 of the second conductive layer L2 in the first hole VA and an inner surface 20S of the second basement 20 in the first hole VA. For example, it is preferable that the connecting material C contains metal materials such as silver, and a particle diameter of the metal material includes fine particles of the order of several nanometers to several tens of nanometers.

In addition, as illustrated in FIG. 6, the connecting material C comes into contact with an inner surface of the fourth hole VD at a gap between the first substrate SUB1 and the second substrate SUB2. It should be noted that the inner surface of the fourth hole VD is provided with an inner surface OIS of the organic insulating layer OI in the fourth hole VD. Since the fourth hole VD is extended in a radial direction from the first and third holes VA and VC, the connecting material C has an enlarged diameter portion CB that is expanded in a radial direction from an inner surface 20S of the first hole VA and an inner surface LS1 of the third hole VC at a gap between the first substrate SUB1 and the second substrate SUB2.

In addition, the connecting material C comes into contact with the upper surface LT1 of the first conductive layer L1, the inner surface of the third hole VC, and the concavity CC, respectively, in the first substrate SUB1. The inner surface of the third hole VC is provided with the inner surface LS1 of the first conductive layer L1 in the third hole VC. The above-described enlarged diameter portion CB comes into contact with the upper surface LT1 of the first conductive layer L1.

In the examples illustrated in FIGS. 5 and 6, the connecting material C is provided over the inner surface (inner surface LS2, inner surface 20S) of the first hole VA, the inner surface (inner surface OIS) of the fourth hole VD, the inner surface (inner surface LS1) of the third hole VC, and the concavity CC and provided in the vicinity thereof, but the connecting material C is not filled in the vicinity of the centers of the first, third and fourth holes VA, VC, VD. For this reason, the connecting material C has a hollow. The connecting material C having the shape is formed by injecting the connecting material C from the first hole VA under a barometric pressure or under the environment of atmospheric pressure lower than the barometric pressure and removing a solvent contained in the connecting material C.

As illustrated in FIG. 5, the second conductive layer L2 and the connecting material C are covered with the protective film PF. The protective film PF also fills the hollow of the connecting material C. The protective film PF is formed of, for example, organic insulating materials such as an acrylic resin. It should be noted that the connecting material C may be formed not to have the hollow. An adhesive layer AD2 is formed over the protective film PF and a second polarizer PL2 is attached to the protective film PF via the adhesive layer AD2.

The connecting material C is continuously formed between the first conductive layer L1 and the second conductive layer L2 without being interrupted. By doing so, the second conductive layer L2 is electrically connected to the above-described wiring substrate SUB3 via the connecting material C and the first conductive layer L1. For this reason, a control circuit that writes a signal into the second conductive layer L2 or reads a signal output from the second conductive layer L2 can be connected to the second conductive layer L2 via the wiring substrate SUB3. Therefore, in order to connect the second conductive layer L2 and the control circuit, there is no need to separately provide a wiring substrate for the second substrate SUB2.

Next, the second hole VB will be described in detail.

The second hole VB penetrates the first basement 10 from a third opening OP3 opened to a bottom of the contact hole V to a fourth opening OP4 opened to the second main surface 10B. In the example illustrated in FIG. 5, the third opening OP3 that is an upper end of the second hole VB is formed in the concavity CC. The third opening OP3 that is an upper end of the second hole VB is opposed to the second opening OP2 that is a lower end of the first hole VA.

The adhesive layer AD1 is formed over the second main surface 10B and is attached to the first polarizer PL1 via the adhesive layer AD1. The fourth opening OP4 that is a lower end of the second hole VB is closed by the first polarizer PL1 or the adhesive layer AD1. As the example illustrated in FIG. 5, the fourth opening OP4 may be closed by the seal SE2.

FIG. 7 is a cross-sectional view illustrating one configuration example of the second hole VB. In the example illustrated in FIG. 7, the first hole VA is formed to be tapered from the fourth main surface 20B of the second basement 20 toward the third main surface 20A thereof. That is, a width (inner diameter) of the first hole VA is reduced from the fourth main surface 20B toward the third main surface 20A. Similarly, the second hole VB is formed to be tapered from the first main surface 10A of the first basement 10 toward the second main surface 10B thereof. That is, a width (inner diameter) of the second hole VB is reduced from the first main surface 10A toward the second main surface 10B.

Comparing the first hole VA with the second hole VB, a gradient T2 formed between the central axis of the second hole VB and the inner surface 10S of the second hole VB is smaller than a gradient T1 formed between the central axis of the first hole VA and the inner surface 20S of the first hole VA. With such a shape, it is possible to suppress the connecting material C filled from the first hole VA from spreading to the second hole VB due to a capillary phenomenon and prevent the connecting material C from leaking through the second hole VB.

In the example illustrated in FIG. 7, an axial direction of the first hole VA coincides with a normal direction of the third main surface 20A of the second basement 20 and an axial direction of the second hole VB coincides with the second main surface 10B of the first basement 10. For this reason, in the example illustrated in FIG. 7, it can be said that the gradient T2 is an inclination angle of the inner surface 20S of the first hole VA with respect to a normal line of the third main surface 20A. It can be said that the gradient T1 is, for example, an inclination angle of the inner surface 10S of the second hole VB with respect to the normal line direction of the second main surface 10B.

As illustrated in FIG. 7, a protruding portion CA filled with a part of the connecting material C may be formed at the upper end of the second hole VB. In this case, the connecting material C stops in the middle of the second hole VB, and thus is filled not to reach the fourth opening OP4 of the second main surface 10B.

FIG. 8 is a cross-sectional view illustrating another configuration example of the second hole VB. The second hole VB illustrated in FIG. 8 is different from the example illustrated in FIG. 7 in that it is formed to be thickened from the first main surface 10A toward the second main surface 10B. That is, a width (inner diameter) of the second hole VB is increased from the first main surface 10A toward the second main surface 10B. With such a shape, it is possible to increase the resistance when the connecting material C passes through the second hole VB by the capillary phenomenon to prevent the connecting material C from leaking through the second hole VB. Similarly to FIG. 7, the connecting material C has the protruding portion CA that protrudes from the contact hole V and is located in the second hole VB.

FIG. 9 is a cross-sectional view illustrating another configuration example of the second hole VB. The central axis of the second hole VB indicated by a one dot chain line in FIG. 9 is inclined in a direction perpendicular to the first main surface 10A, that is, in the third direction Z. With such a shape, comparing with the case where the central axis is parallel to the third direction Z, the second hole VB becomes long. Accordingly, the connecting material C does not easily reach the fourth opening OP4 of the second hole VB, and it is possible to prevent the connecting material C from leaking through the second hole VB.

For example, when a plurality of contact holes V are disposed to be adjacent to each other, if the inclinations of the second holes VB are aligned in the same direction, the second holes VB communicating with each of the contact holes V can be disposed not to interfere with each other. Alternatively, if the fourth opening OP4 is disposed to be included in the first opening OP1 when viewed in planar view, the second holes VB communicating with each of the contact holes V can be disposed not to interfere with each other without relying on the inclined direction of the second hole VB.

FIG. 10 is a cross-sectional view illustrating another configuration example of the second hole VB. The second hole VB illustrated in FIG. 10 has a bent portion VBC and is bent on the way to the second main surface 10B. For example, the second hole VB having the shape can be formed by irradiating laser light that causes cracks only in the focused inside without damaging the surface. Alternatively, after a bottomed hole extending in the second direction Y is formed by irradiating laser light from the side surface of the first basement 10, the second hole VB can be formed by irradiating with laser light in the third direction Z. Even in the shape of the second hole VB illustrated in FIG. 10, the second hole VB becomes long and the resistance of the connecting material C passing through the second hole VB increases such that it is possible to prevent the connecting material C from leaking through the second hole VB.

FIG. 11 is a cross-sectional view illustrating another configuration example of the second hole VB. The second hole VB illustrated in FIG. 11 is branched on the way and bent. That is, the second hole VB has two bent portions VBC and two fourth openings OP4. Even in the shape of the second hole VB illustrated in FIG. 11, the second hole VB becomes long and the resistance of the connecting material C passing through the second hole VB increases, such that it is possible to prevent the connecting material C from leaking through the second hole VB.

In FIGS. 10 and 11, the second hole VB is vertically bent at the bent portion VBC, but the second hole VB may also be smoothly bent at the bent portion VBC. In addition, FIGS. 5 to 11 illustrate an example in which one second hole VB is provided for one contact hole V, but the plurality of second holes VB may be provided for one contact hole V.

Figure 12:
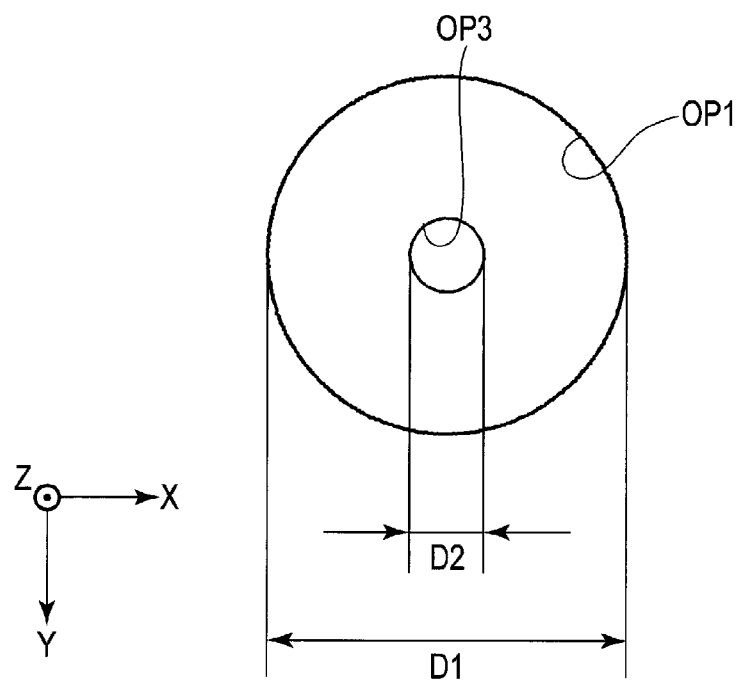
FIG. 12 is a plan view illustrating a configuration example of a first opening OP1 and a third opening OP3 of the first embodiment.
Figure 13:
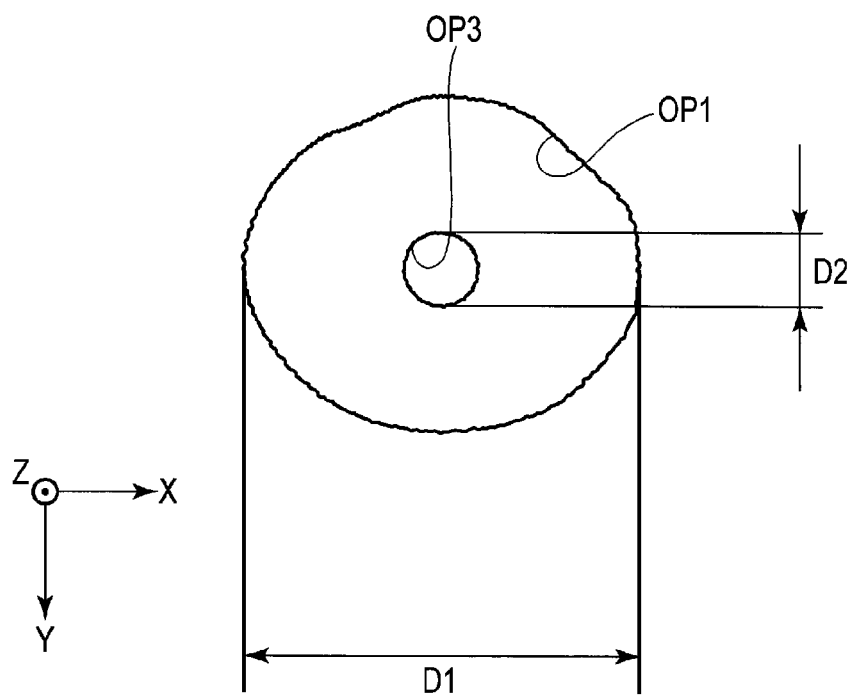
FIG. 13 is a plan view illustrating another configuration example of the first opening OP1 and the third opening OP3 of the first embodiment.

FIG. 12 is a plan view of a configuration example of the second hole VB, and FIG. 13 is a plan view of another configuration example of the second hole VB. As illustrated in FIG. 12, the third opening OP3 is formed to be smaller than the first opening OP1 of the first hole VA and is opposed to the first hole VA in the third direction Z. A diameter D2 of the third opening OP3 at the upper end of the second hole VB is, for example, ⅕ or less of a diameter D1 of the first opening OP1 at the upper end of the first hole VA. The diameter D2 of the third opening OP3 is, for example, 5 μm or more or 30 μm or less.

In this case, when the first and third openings OP1 and OP3 are a regular circle, the diameters D1 and D2 of the first and third openings OP1 and OP3 are, for example, the same diameter, and when the first and third openings OP1 and OP3 are ellipses, the diameters D1 and D2 of the first and third openings OP1 and OP3 are, for example, a long diameter. As the example illustrated in FIG. 13, when the first and third openings OP1 and OP3 are a distorted circle, the diameters D1, D2 may be a maximum diameter. Alternatively, an area of the third opening OP3 may be, for example, ¹/25 or less of an area of the first opening OP1 when viewed in planar view.

According to the configuration in which the first opening OP1 and the third opening OP3 have the size relationship, a diameter of a droplet of the connecting material C injected from the first opening OP1 into the first hole VA becomes larger than that of the third opening OP3 of the second hole VB, thereby preventing the connecting material C from leaking from the third opening OP3.

Next, an example of a method for manufacturing a display device DSP will be described with reference to FIGS. 14 to 23.

First, as illustrated in FIG. 14, a display panel PNL is prepared. The display panel PNL illustrated in FIG. 14 includes the first substrate SUB1 including at least the first basement 10 and the first conductive layer L1 and the second substrate SUB2 including at least the second basement 20 and the second conductive layer L2. In the display panel PNL, the first substrate SUB1 and the second substrate SUB2 adhere to each other by the seal SE in the state where the second basement 20 is opposed to the first conductive layer L1 and the second basement 20 is spaced apart from the first conductive layer L1. The second conductive layer L2 is provided with the second hole VB in advance and the surface thereof is covered with the protective film PF.

Describing an example of the method for manufacturing a display panel PNL, the first substrate SUB1 having the first conductive layer L1 or the second insulating layer 12 or the like formed over the first main surface 10A of the first basement 10 is prepared. The second substrate SUB2 having the light-shielding layer BM, the overcoat layer OC or the like formed over the third main surface 20A of the second basement 20 is prepared.

At this point, the second conductive layer L2 is not formed over the fourth main surface 20B of the second substrate SUB2. A loop-shaped seal SE is formed on any one of the first substrate SUB1 and the second substrate SUB2, and a liquid crystal material drops into the seal SE. Thereafter, the first substrate SUB1 and the second substrate SUB2 are bonded to each other, and the seal SE is cured so that the first substrate SUB1 adheres to the second substrate SUB2.

Thereafter, the first basement 10 and the second basement 20 are each etched with an etchant such as hydrofluoric acid (HF) to make the first basement 10 and the second basement 20 thin. Thereafter, the second conductive layer L2 is formed over the fourth main surface 20B of the second basement 20. At this point, the second hole VB can be patterned at the same time. Note that the second conductive layer L2 may be formed first, and then the second hole VB may be formed. By doing so, the display panel PNL illustrated in FIG. 14 is manufactured.

Another example of the method for manufacturing a display panel PNL will be described. That is, similarly to the above example, while the first substrate SUB1 is prepared, the light-shielding layer BM, the overcoat layer OC or the like are formed over the third main surface 20A of the second basement 20 and the second substrate SUB2 on which the second conductive layer L2 having the second hole VB patterned over the fourth main surface 20B of the second basement 20 is formed is prepared. Thereafter, the seal SE is formed, the liquid crystal material drops, and then the first substrate SUB1 and the second substrate SUB2 adhere to each other. By doing so, the display panel PNL illustrated in FIG. 14 is manufactured.

Subsequently, as illustrated in FIG. 15, the second substrate SUB2 is irradiated with first laser light LSR1. In the example illustrated in FIG. 15, the first laser light LSR1 is irradiated from above the second conductive layer L2. As a laser light source, for example, a carbon dioxide gas laser device or the like can be applied, but any device that can perform a drilling process on a glass material and an organic material can be used, and an excimer laser device or the like can also be applied.

As illustrated in FIG. 16, the first hole VA penetrating the second basement 20 and the second conductive layer L2 is formed by irradiating the first laser light LSR1. In addition, in the example illustrated in FIG. 16, when the first laser light LSR1 is irradiated, the third portion VD3 of the fourth hole VD penetrating the light-shielding layer BM and the overcoat layer OC, the second portion VD2 penetrating the seal SE, the first portion VD1 penetrating the second insulating layer 12, the third hole VC penetrating the first conductive layer L1, and the concavity CC of the first basement 10 are formed at the same time. By doing so, the contact hole V for connecting the first conductive layer L1 and the second conductive layer L2 is formed.

Figure 18:
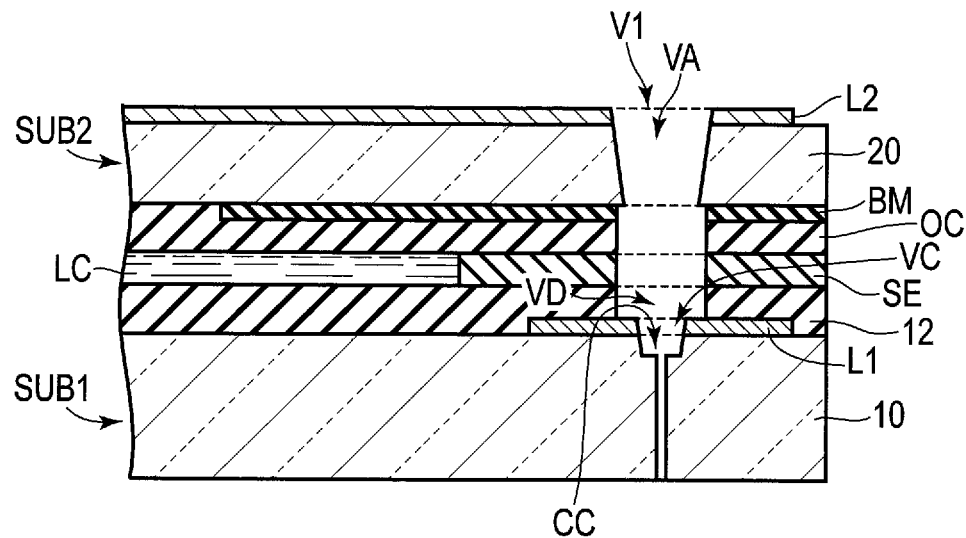
FIG. 18 is a cross-sectional view for describing the method for manufacturing a display device DSP subsequent to FIG. 17.

Furthermore, as illustrated in FIG. 17, the first basement 10 is irradiated with second laser light LSR2 via the contact hole V. The second laser light LSR2 has a smaller diameter than the first laser light LSR1. For example, if an optical axis of the first laser light LSR1 coincides with that of the second laser light LSR2, the laser light can be applied continuously without moving the laser light source. As illustrated in FIG. 18, the second hole VB penetrating the first basement 10 is formed on the bottom of the contact hole V by the second laser light LSR2.

Figure 19:
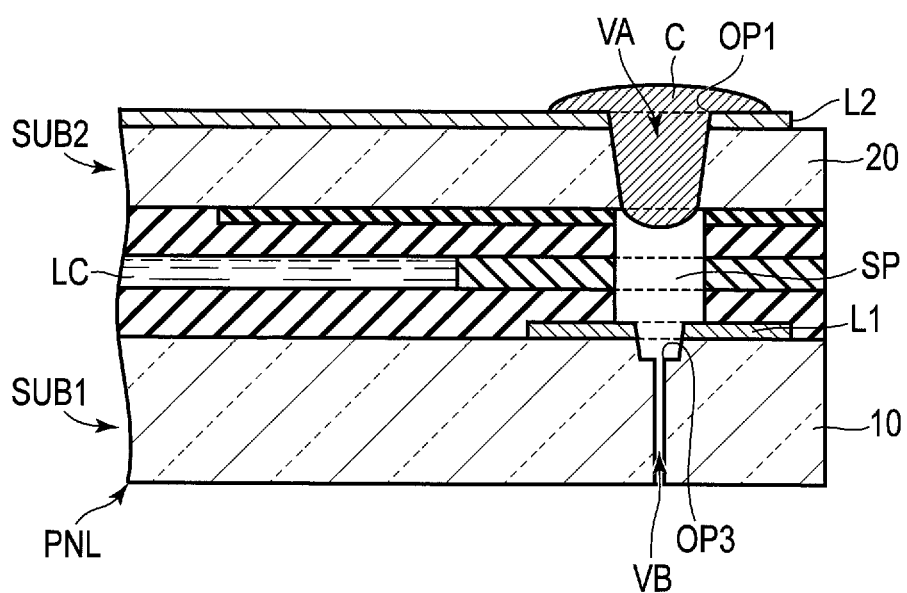
FIG. 19 is a cross-sectional view for describing the method for manufacturing a display device DSP subsequent to FIG. 18.

Subsequently, the connecting material C for electrically connecting the first conductive layer L1 and the second conductive layer L2 is formed. First, as illustrated in FIG. 19, the connecting material C is injected into the first hole VA. An injection device may be an ink jet or a dispenser. An example of the diameter of the droplet of the connecting material C injected by these devices is about ⅕ of the diameter of the first opening OP1.

An internal space SP in which gases such as air remain is formed between the connecting material C and the first conductive layer L1 by the injected connecting material C. However, as illustrated in FIG. 20, if the gases remaining in the internal space SP are released from the second hole VB, the connecting material C flows from the first hole VA into the third and fourth holes VC and VD and the concavity CC.

At this point, the gas may be expelled from the second hole VB by a weight of the connecting material C. Inert gas such as nitrogen gas or argon may be blown from the second substrate SUB2 side to push the connecting material C into the contact hole V and the gas may also be expelled from the second hole VB. Alternatively, gas may be sucked from the second main surface 10B side and sucked out from the second hole VB. If the gases remaining in the internal space SP are degassed through the second hole VB, the connecting material C injected into the contact hole V comes into contact with the first conductive layer L1.

Thereafter, as illustrated in FIG. 21, a volume of the connecting material C is reduced by removing the solvent contained in the connecting material C to form the hollow. The connecting material C thus formed comes into contact with the second conductive layer L2 and the second basement 20, respectively, in the first hole VA and comes into contact with the light-shielding layer BM, the overcoat layer OC, the seal SE, and the second insulating layer 12, respectively, in the fourth hole VD, and comes into contact with the first conductive layer L1 in the third hole VC, and comes into contact with the first basement 10 in the concavity CC.

Figure 22:
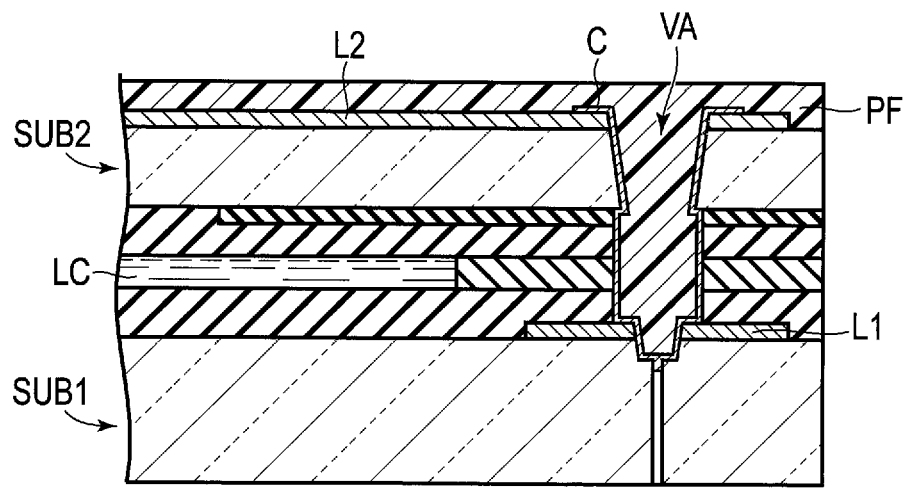
FIG. 22 is a cross-sectional view for describing the method for manufacturing a display device DSP subsequent to FIG. 21.

Next, as illustrated in FIG. 22, the protective film PF is formed. In the example illustrated in FIG. 22, the protective film PF is filled in the hollow of the connecting material C and covers the second conductive layer L2 and the connecting material C. By doing so, a surface SUB2A of the second substrate SUB2 is substantially planarized, and the difference in level of the portion overlaying the contact hole V can be alleviated.

Figure 23:
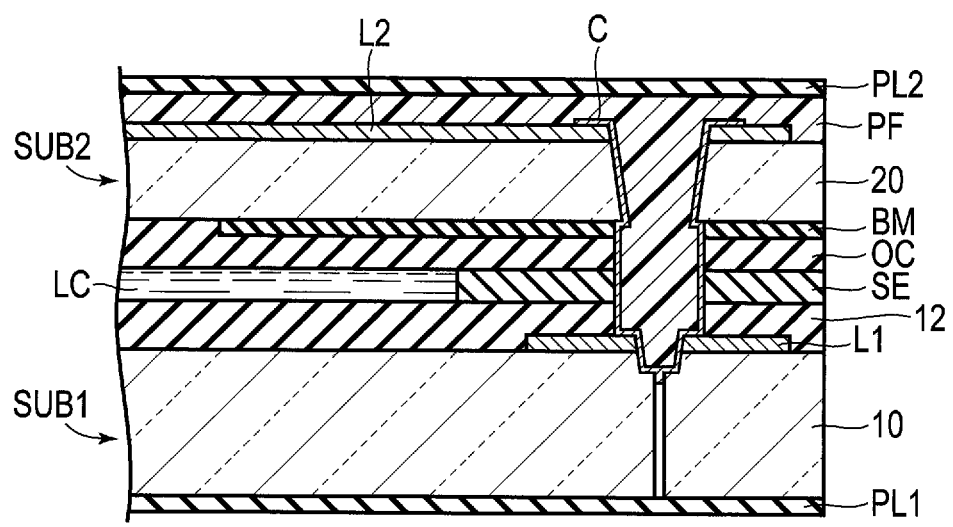
FIG. 23 is a cross-sectional view for describing the method for manufacturing a display device DSP subsequent to FIG. 22.

Subsequently, as illustrated in FIG. 23, the first polarizer PL1 adheres to the first basement 10 and the second polarizer PL2 adheres to the protective film PF. It should be noted that although the adhesive layers AD1 and AD2 are interposed between the first polarizer PL1 and the first basement 10 and between the second polarizer PL2 and the protective film PF, the illustration thereof is omitted here.

In the example illustrated in FIG. 23, the second polarizer PL2 also extends to the portion overlaying the contact hole V. Since the difference in level caused by the contact hole V is alleviated by the protective film PF, it is possible to suppress the second polarizer PL2 from being peeled due to a difference in level of a base portion of the second polarizer PL2 at the time of the adhesion of the second polarizer PL2.

According to the display device DSP described above, the detection electrode Rx provided on the second substrate SUB2 is connected to the pad P provided on the first substrate SUB1 by the connecting material C provided in the contact hole V. For this reason, there is no need to mount the wiring substrate for connecting the detection electrode Rx and the detection circuit RC on the second substrate SUB2. In other words, the wiring substrate SUB3 mounted on the first substrate SUB1 forms a transmission path for transmitting a signal necessary for displaying an image on the display panel PNL, and at the same time, forms a transmission path for transmitting a signal between the detection electrode Rx and the detection circuit RC.

Therefore, the number of wiring substrates can be reduced and the cost can be reduced, as compared with the configuration example requiring a separate wiring substrate in addition to the wiring substrate SUB3. In addition, since a space for connecting the wiring substrate to the second substrate SUB2 is unnecessary, a width of a non-display area of the display panel PNL, in particular, a width of a side edge on which the wiring substrate SUB3 is mounted can be reduced. This makes it possible to narrow the frame and reduce the cost.

In addition, since the connecting material C comes into contact with not only the inner surface LS2 of the second conductive layer L2 in the first hole VA but also the upper surface LT2 of the second conductive layer L2, the contact area between the connecting material C and the second conductive layer L2 may be expanded, and the poor connection between the connecting material C and the second conductive layer L2 can be suppressed.

In addition, since the connecting material C comes into contact with not only the inner surface LS1 of the first conductive layer L1 in the third hole VC but also the upper surface LT1 of the first conductive layer L1, the contact area between the connecting material C and the first conductive layer L1 may be expanded, and the poor connection between the connecting material C and the first conductive layer L1 can be suppressed.

In addition, the hollow of the connecting material C is filled with the protective film PF, such that it is possible to alleviate the difference in level in the third direction Z due to the formation of the hollow in the connecting material C. In addition, since the protective film PF covers the connecting material C and the second conductive layer L2, the protective film PF can protect the connecting material C and the second conductive layer L2.

In the present embodiment, the gases remaining in the contact hole V can be released to the outside via the second hole VB. If the gases remain in the contact hole V, bubbles or the like are generated in the connecting material C, which is a cause of poor filling. According to the present embodiment, it is possible to prevent the poor filling of the connecting material C and improve the connection reliability of the display device DSP.

In addition, the connecting material C has a protruding portion CA which protrudes from the contact hole V and is located at the upper end of the second hole VB. Since the connecting material C is filled up to the middle of the second hole VB releasing gases and the gases inside the contact hole V are expelled sufficiently, it is possible to reliably bring the connecting material C and the first conductive layer L1 into contact with each other.

According to the manufacturing method according to the present embodiment, it is possible to fill the connecting material C under the barometric pressure. If there is no second hole VB, the display device DSP is put into a vacuum chamber and it is conceivable to fill the connecting material C under the vacuum atmosphere in which the gases remaining in the contact hole V are removed in advance. In the process, since it takes time to decompress the vacuum chamber and convey and put the display device DSP into the vacuum chamber, a cycle time becomes long. In contrast, in the manufacturing method according to the present embodiment, since the connecting material C can be filled under the barometric pressure, it is possible to shorten the cycle time by omitting the processes involved for the decompression and conveyance.

In addition, if the display device DSP is put under the vacuum atmosphere, volatile components slightly contained in the various organic insulating layers OI may expand to generate bubbles. Alternatively, the solvent contained in the connecting material C may often generate bubbles in the connecting material C. As a result, there is a risk that a load may be applied to the first and second basements 10 and 20 that are formed to be very thin. If the connecting material C is filled under the barometric pressure, the generation of bubbles can be suppressed to prevent cracks or the like from being generated in the first and second basements 10 and 20.

It should be noted that even when the vacuum chamber is used for the filling of the connecting material C, the inside of the contact hole V can be more reliably degassed if there is the second hole VB. According to the present embodiment having the second hole VB and the manufacturing method thereof, it is possible to further improve the connection reliability by preventing the poor filling of the connecting material C.

Subsequently, the display device DSP of the second embodiment will be described with reference to FIG. 24. It should be noted that components having functions similar to those of the display device DSP of the first embodiment are denoted by the same reference numerals, and the description thereof will be omitted. In the display device DSP of the second embodiment, a third hole VC and a concavity CC are not included in a contact hole V. For this reason, the second embodiment differs from the first embodiment in that a second hole VB is not formed at the bottom surface of the concavity CC but is formed to penetrate through a first conductive layer L1 and a first basement 10. Other components are the same as those of the first embodiment. As illustrated in FIG. 24, even if the second hole VB is provided in a layer other than the concavity CC, it is possible to form a flow path for releasing the gas from the inside of the contact hole V as in the first embodiment.

According to the second embodiment, even combinations of materials which cannot form the concavity CC in the first basement 10 form the second hole VB to fill the contact hole V with the connecting material C. For example, the melting point of the material forming the first conductive layer L1 may be a higher temperature than that of the material forming the second conductive layer L2 or the first and second basements 10 and 20.

As described above, according to the present embodiment, it is possible to provide an electronic apparatus capable of narrowing the frame and reducing costs, and a method for manufacturing the same.

An example of the display device obtained from the structure disclosed in this specification will be appended.

(1) An electronic apparatus, comprising:
a first substrate including a first basement and a first conductive layer;
a second substrate including a second basement and a second conductive layer; and
a connecting material electrically connecting the first conductive layer and the second conductive layer,
wherein the first basement includes a first surface and a second surface opposite to the first surface,
the first conductive layer is located over the first surface,
the second basement includes a third surface, a fourth surface opposite to the third surface, and a first hole penetrating the second basement,
the third surface is opposed to the first conductive layer and spaced apart from the first conductive layer,
the second conductive layer is located on the fourth surface,
the first hole includes a first opening formed on the fourth surface and a second opening formed on the third surface,
the connecting material contacts the first conductive layer and the second conductive layer via the first hole,
the first basement further includes a second hole that penetrates the first basement and connects to the first hole, and
the second hole includes a third opening that is smaller than the first opening and is opposed to the second opening and a fourth opening that is formed on the second surface.

(2) The electronic apparatus according to (1), wherein a diameter of the fourth opening is larger than that of the third opening.

(3) The electronic apparatus according to (1), wherein a diameter of the second opening is smaller than that of the first opening,
a diameter of the fourth opening is smaller than that of the third opening, and a gradient formed by a central axis of the second hole and an inner surface of the second hole is smaller than that formed by a central axis of the first hole and an inner surface of the first hole.

(4) The electronic apparatus according to (1) to (3), wherein the first basement includes a concavity connecting to the second hole, and
the third opening is opened to a bottom of the concavity.

(5) The electronic apparatus according to (4), wherein the first conductive layer includes the first hole and a third hole opposed to the concavity, and
the second hole connects to the first hole via the third hole and the concavity.

(6) The electronic apparatus according to (1) to (5), wherein a diameter of the third opening is ⅕ or less of that of the first opening.

(7) The electronic apparatus according to (1) to (6), wherein a diameter of the third opening is 5 μm or more and 30 μm or less.

(8) The electronic apparatus according to (1) to (7), wherein a central axis of the second hole is inclined with respect to a direction perpendicular to the first surface.

(9) The electronic apparatus according to (1) to (8), wherein the second hole has a bent portion.

(10) The electronic apparatus according to (1) to (9), wherein the connecting material is filled in a part of the second hole.

(11) The electronic apparatus according to (1) to (10), further comprising:
a seal configured to bond the first substrate to the second substrate,
wherein the seal includes a fourth hole through which the first hole and the second hole connects to each other.

(12) A method for manufacturing an electronic apparatus, comprising:
preparing a first substrate including a first basement and a first conductive layer and a second substrate including a second basement and a second conductive layer, the second basement being opposed to the first conductive layer and spaced apart from the first conductive layer;
forming a first hole penetrating the second basement,
forming a second hole penetrating the first basement, and
forming a connecting material electrically connecting the first conductive layer and the second conductive layer in the first hole by filling the first hole with a conductive material.

(13) The method according to (12), further comprising:
forming the first hole and a third hole penetrating the first conductive layer opposed to the first hole by irradiating first laser light to the second substrate.

For example, in the method for manufacturing a display device described above, although the first hole VA is formed and then the second hole VB is formed, the second hole VB can be formed in advance and the first hole VA may be formed later. In order to form the second hole VB, the laser light LSR2 is irradiated from the second substrate SUB2 side, that is, from above the second substrate SUB2, but the laser light LSR2 may be irradiated from the first substrate SUB1 side, that is, from under the first substrate SUB1 to form the second hole VB. In this case, as illustrated in FIG. 8, it is possible to form the second hole VB having a diameter increased from the first surface 10A toward the second surface 10B.

What is claimed is:
1. An electronic apparatus, comprising:
a first substrate including a first glass substrate and a first conductive layer;
a second substrate including a second glass substrate and a second conductive layer;
a seal configured to bond the first substrate to the second substrate; and a connecting material electrically connecting the first conductive layer and the second conductive layer, wherein the first glass substrate includes a first surface and a second surface opposite to the first surface, the first conductive layer is located over the first surface, the second glass substrate includes a third surface, a fourth surface opposite to the third surface, and a first hole penetrating the second glass substrate, the third surface is opposed to the first conductive layer and spaced apart from the first conductive layer, the second conductive layer is located on the fourth surface, the first hole includes a first opening formed on the fourth surface and a second opening formed on the third surface, the connecting material contacts the first conductive layer and the second conductive layer via the first hole, the first glass substrate further includes a second hole that penetrates the first glass substrate and connects to the first hole, the second hole includes a third opening that is smaller than the first opening and is opposed to the second opening and a fourth opening that is formed on the second surface, the seal includes a fourth hole through which the first hole and the second hole communicate with each other, and a diameter of the fourth hole is larger than a diameter of the second opening and a diameter of the third opening.

2. The electronic apparatus according to claim 1, wherein a diameter of the fourth opening is larger than the diameter of the third opening.

3. The electronic apparatus according to claim 1, wherein the diameter of the second opening is smaller than a diameter of the first opening, a diameter of the fourth opening is smaller than a diameter of the third opening, and a gradient formed by a central axis of the second hole and an inner surface of the second hole is smaller than formed by a central axis of the first hole and an inner surface of the first hole.

4. The electronic apparatus according to claim 1, wherein the first glass substrate includes a concavity connecting to the second hole, and the third opening is opened to a bottom of the concavity.

5. The electronic apparatus according to claim 4, wherein the first conductive layer includes the first hole and a third hole opposed to the concavity, and the second hole connects to the first hole via the third hole and the concavity.

6. The electronic apparatus according to claim 1, wherein a diameter of the third opening is ⅕ or less of a diameter of the first opening.

7. The electronic apparatus according to claim 1, wherein the diameter of the third opening is 5 μm or more and 30 μm or less.

8. The electronic apparatus according to claim 1, wherein a central axis of the second hole is inclined with respect to a direction perpendicular to the first surface, and the central axis of the second hole is inclined with respect to a central axis of the first hole.

9. The electronic apparatus according to claim 1, wherein the second hole has a bent portion, and a central axis of the second hole is bent at the bent portion.

10. The electronic apparatus according to claim 1, wherein the connecting material is filled in a part of the second hole.

11. A method for manufacturing an electronic apparatus, comprising:

preparing a first substrate including a first glass substrate and a first conductive layer and a second substrate including a second glass substrate and a second conductive layer, the second glass substrate being opposed to the first conductive layer and spaced apart from the first conductive layer, the first substrate and the second substrate being bonded to each other by a seal;

forming a first hole penetrating the second glass substrate and a fourth hole penetrating the seal, forming a second hole penetrating the first glass substrate and communicating with the first hole through the fourth hole, and forming a connecting material electrically connecting between the first conductive layer and the second conductive layer in the first hole and the fourth hole by filling the first hole and the fourth hole with a conductive material, wherein the first glass substrate includes a first surface and a second surface opposite to the first surface, the first conductive layer is located over the first surface, the second glass substrate includes a third surface opposed to the first conductive layer and a fourth surface opposite to the third surface, the second conductive layer is located on the fourth surface, the first hole includes a first opening formed on the fourth surface and a second opening formed on the third surface, the second hole includes a third opening that is smaller than the first opening and is opposed to the second opening and a fourth opening that is formed on the second surface, and a diameter of the fourth hole is larger than a diameter of the second opening and a diameter of the third opening.

12. The method according to claim 11, further comprising:

forming the first hole, the fourth hole and a third hole penetrating the first conductive layer opposed to the first hole by irradiating first laser light to the second substrate.

13. The electronic apparatus according to claim 1, wherein the second hole is branched and includes two of the fourth opening.

14. The electronic apparatus according to claim 1, wherein a diameter of the second hole is constant between the third opening and the fourth opening.

* * * * *